(12) United States Patent
Mori et al.

(10) Patent No.: US 11,205,632 B2
(45) Date of Patent: Dec. 21, 2021

(54) WIRING SUBSTRATE AND SEMICONDUCTOR DEVICE

(71) Applicant: SHINKO ELECTRIC INDUSTRIES CO., LTD., Nagano (JP)

(72) Inventors: Kenichi Mori, Nagano (JP); Takehito Terasawa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 43 days.

(21) Appl. No.: 16/683,651

(22) Filed: Nov. 14, 2019

(65) Prior Publication Data

US 2020/0161271 A1 May 21, 2020

(30) Foreign Application Priority Data

Nov. 16, 2018 (JP) .............................. JP2018-215656

(51) Int. Cl.
*H01L 23/00* (2006.01)
*H05K 1/02* (2006.01)
*H05K 1/18* (2006.01)

(52) U.S. Cl.
CPC ............. *H01L 24/45* (2013.01); *H05K 1/028* (2013.01); *H05K 1/0224* (2013.01); *H05K 1/0298* (2013.01); *H05K 1/181* (2013.01)

(58) Field of Classification Search
CPC .... H05K 1/0224; H05K 1/0298; H05K 1/181; H05K 1/028; H05K 1/0219; H05K 2201/09336; H05K 2201/09681; H05K 1/189; H05K 3/4644; H01L 24/45; H01L 24/48; H01L 23/5387; H01L 23/5383
See application file for complete search history.

(56) References Cited

U.S. PATENT DOCUMENTS

2014/0145317 A1* 5/2014 Nakamura ........ H01L 23/49822
257/669
2019/0051592 A1* 2/2019 Kim ........................ H01L 25/18

FOREIGN PATENT DOCUMENTS

JP 2000-114728 4/2000

* cited by examiner

*Primary Examiner* — Jasmine J Clark
(74) *Attorney, Agent, or Firm* — Rankin, Hill & Clark LLP

(57) ABSTRACT

A wiring substrate includes: a plurality of wiring layers; and a plurality of insulating layers. The wiring substrate includes: a mounting region on which an electronic component is to be mounted; and a non-mounting region on which no electronic component is to be mounted and which is configured to be bent in a first direction. At least one of the wiring layers comprises a shield pattern. The shield pattern disposed in the non-mounting region is defined by a plurality of through holes arranged at predetermined intervals. Each of the through holes has a bent portion bent in plan view.

16 Claims, 16 Drawing Sheets

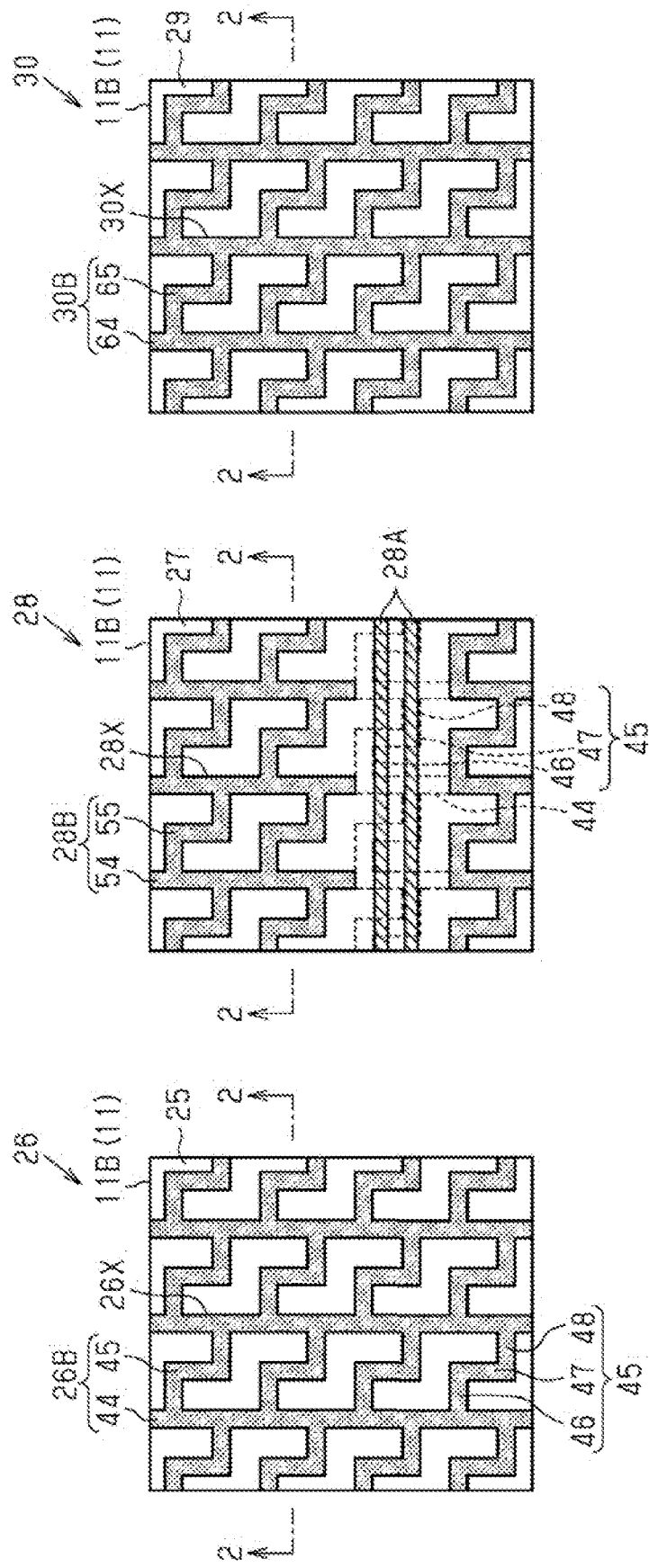

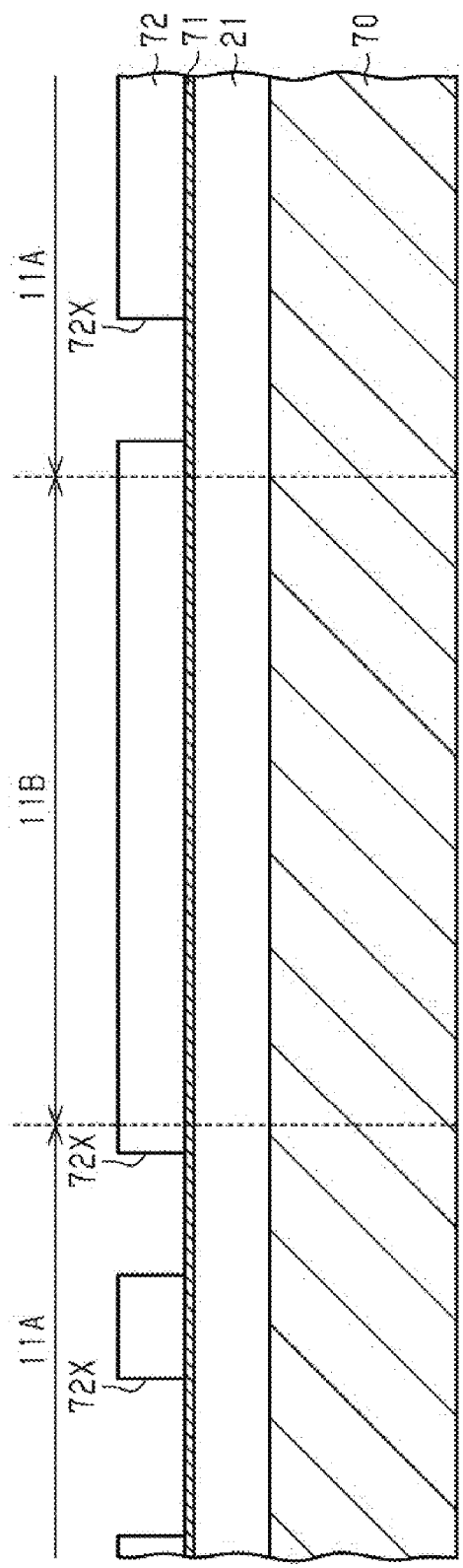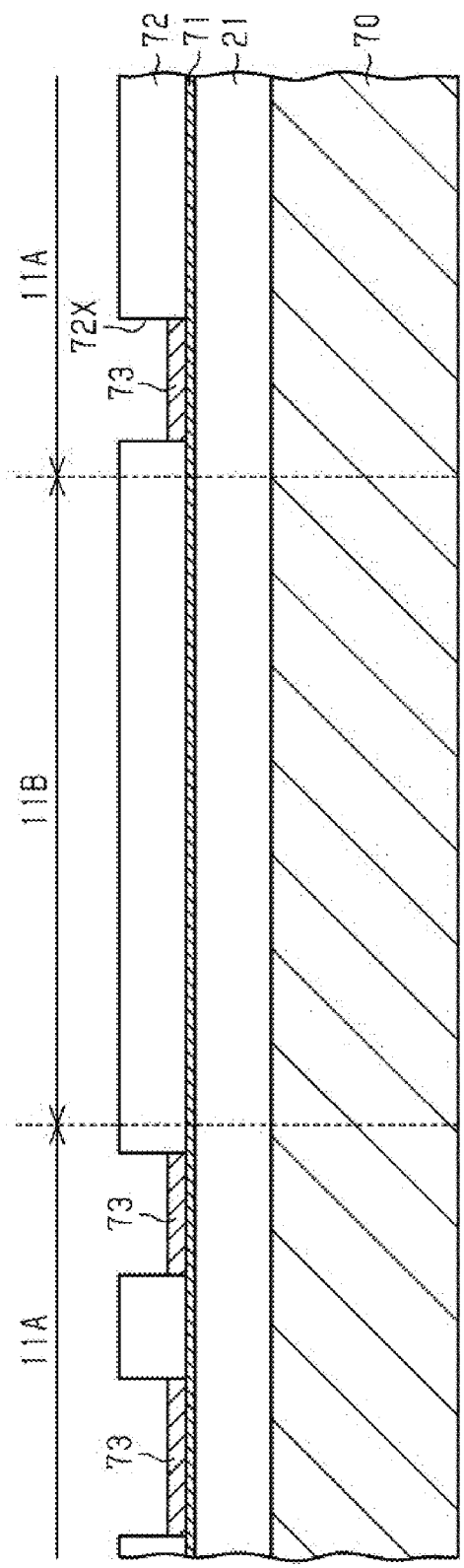

WIRING SUBSTRATE AND SEMICONDUCTOR DEVICE

This application claims priority from Japanese Patent Applications No. 2018-215656, filed on Nov. 16, 2018, the entire contents of which are herein incorporated by reference.

BACKGROUND

1. Technical Field

The present disclosure relates to a wiring substrate and a semiconductor device.

BACKGROUND ART

In the background art, a wiring substrate used for a wearable terminal etc. may be used in a bent state. When the wiring substrate is used in the bent state, wiring patterns or via wirings disposed in a bent portion may be peeled due to stress during the bending so as to result in occurrence of conduction failure. Therefore, there has been proposed a countermeasure to adjust a pitch or a diameter of each of the via wirings in the bent portion (e.g. see JP-A-2000-114728).

Further improvement of bendability has been requested with an increase of the number of layers in the wiring substrate.

SUMMARY

Certain embodiments provide a wiring substrate.
The wiring substrate comprises:
a plurality of wiring layers; and
a plurality of insulating layers.
The wiring substrate comprises:
a mounting region on which an electronic component is to be mounted; and
a non-mounting region on which no electronic component is to be mounted and which is configured to be bent in a first direction.
At least one of the wiring layers comprises a shield pattern.
The shield pattern disposed in the non-mounting region is defined by a plurality of through holes arranged at predetermined intervals.
Each of the through holes has a bent portion bent in plan view.
Certain embodiments provide a semiconductor device comprising: the wiring substrate; and an electronic component which is mounted on the wiring substrate.

BRIEF DESCRIPTION OF DRAWINGS

FIGS. 4A to 4C are schematic sectional views showing the wiring substrate according to the first embodiment;
FIGS. 6A and 6B are schematic sectional views showing the manufacturing method of the wiring substrate according to the first embodiment.

DESCRIPTION OF EMBODIMENTS

Embodiments will be described below with reference to the accompanying drawings. Incidentally, in the accompanying drawings, some characteristic portions may be shown in an enlarged manner for convenience in order to make their characteristics easy to understand, and dimensional ratios etc. of respective constituent elements should not be regarded as identical to their real ones. In addition, in order to make sectional structures of respective members easy to understand in sectional views, hatching of some of the members is replaced by a satin pattern, while the other members are not hatched.

First Embodiment

A first embodiment will be described below in accordance with FIGS. 1 to 11.

Figure 1:
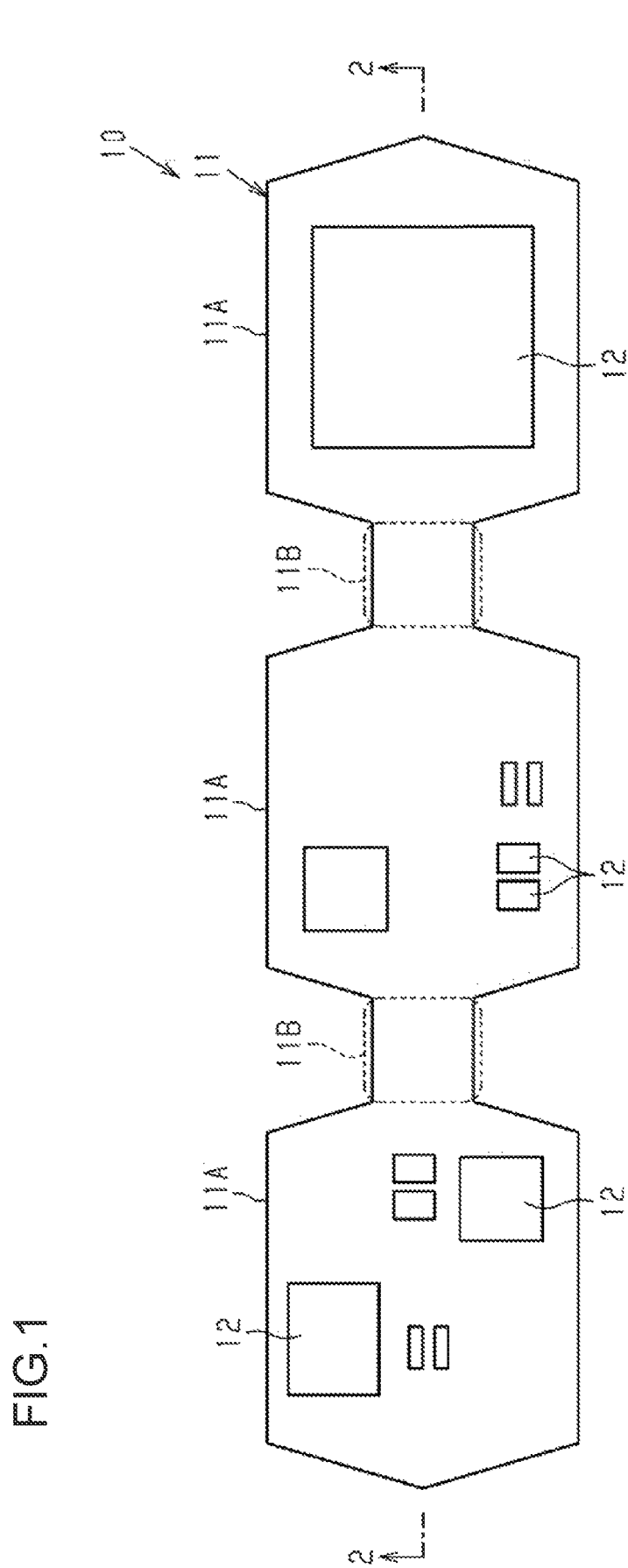
FIG. 1 is a schematic plan view showing a semiconductor device according to a first embodiment.

As shown in FIG. 1, a semiconductor device 10 has a wiring substrate 11, and one or more electronic components 12 mounted on the wiring substrate 11. For example, a semiconductor element, a chip component (such as a chip capacitor, a chip resistor or a chip inductor), a crystal resonator, or the like, can be used as such an electronic component 12. For example, a logic chip such as a CPU (Central Processing Unit) chip, an MPU (Micro Processing Unit) chip or a GPU (Graphics Processing Unit) chip can be used as the semiconductor element. In addition, for example, a memory chip such as a DRAM (Dynamic Random Access Memory) chip, an SRAM (Static Random Access Memory) chip or a flash memory chip can be also used as the semiconductor element.

The wiring substrate 11 is a flexible substrate having flexibility. Here, the term "flexibility" means a property with which the wiring substrate 11 can be made to bend or deflect.

The wiring substrate 11 has mounting regions 11A on which electronic components 12 are mounted, and non-mounting regions 11B which are configured bendably without being mounted with any electronic component 12. The wiring substrate 11 in the present example is provided with three mounting regions 11A and two non-mounting regions 11B which are arranged side by side alternately. Specifically, the three mounting regions 11A and the two non-mounting regions 11B are provided to be arranged side by side alternately along a long direction (a left/right direction in FIG. 1) of the wiring substrate 11.

Each of the non-mounting regions 11B is a bendable region which is designed on the assumption that the wiring substrate 11 is allowed to be bent in a preliminarily predetermined direction. For example, the non-mounting regions 11B are designed on the assumption that the wiring substrate 11 is allowed to be bent in a side-by-side arrangement direction (see arrows indicated in FIG. 1) of the mounting regions 11A and the non-mounting regions 11B. Since such a non-mounting region 11B is provided at one or more places, the wiring substrate 11 can be easily bent in the side-by-side arrangement direction in the non-mounting region 11B. Incidentally, the side-by-side arrangement direction of the mounting regions 11A and the non-mounting regions 11B is consistent with the long direction of the wiring substrate 11. Thus, the side-by-side arrangement direction of the mounting regions 11A and the non-mounting regions 11B or the long direction of the wiring substrate 11 is set as a bending direction (an example of a first direction) in which each of the non-mounting regions 11B is allowed to be bent.

Each of the non-mounting regions 11B is formed between adjacent mounting regions 11A so as to connect the adjacent mounting regions 11A to each other. For example, a dimension of the non-mounting region 11B in a short direction (an up/down direction in FIG. 1) perpendicular to the long direction of the wiring substrate 11 in plan view is shorter than a dimension of each of the mounting regions 11A in the short direction.

The wiring substrate 11 is a multilayer wiring substrate having a structure in which a plurality of wiring layers and a plurality of insulating layers are formed alternately.

Figure 2:
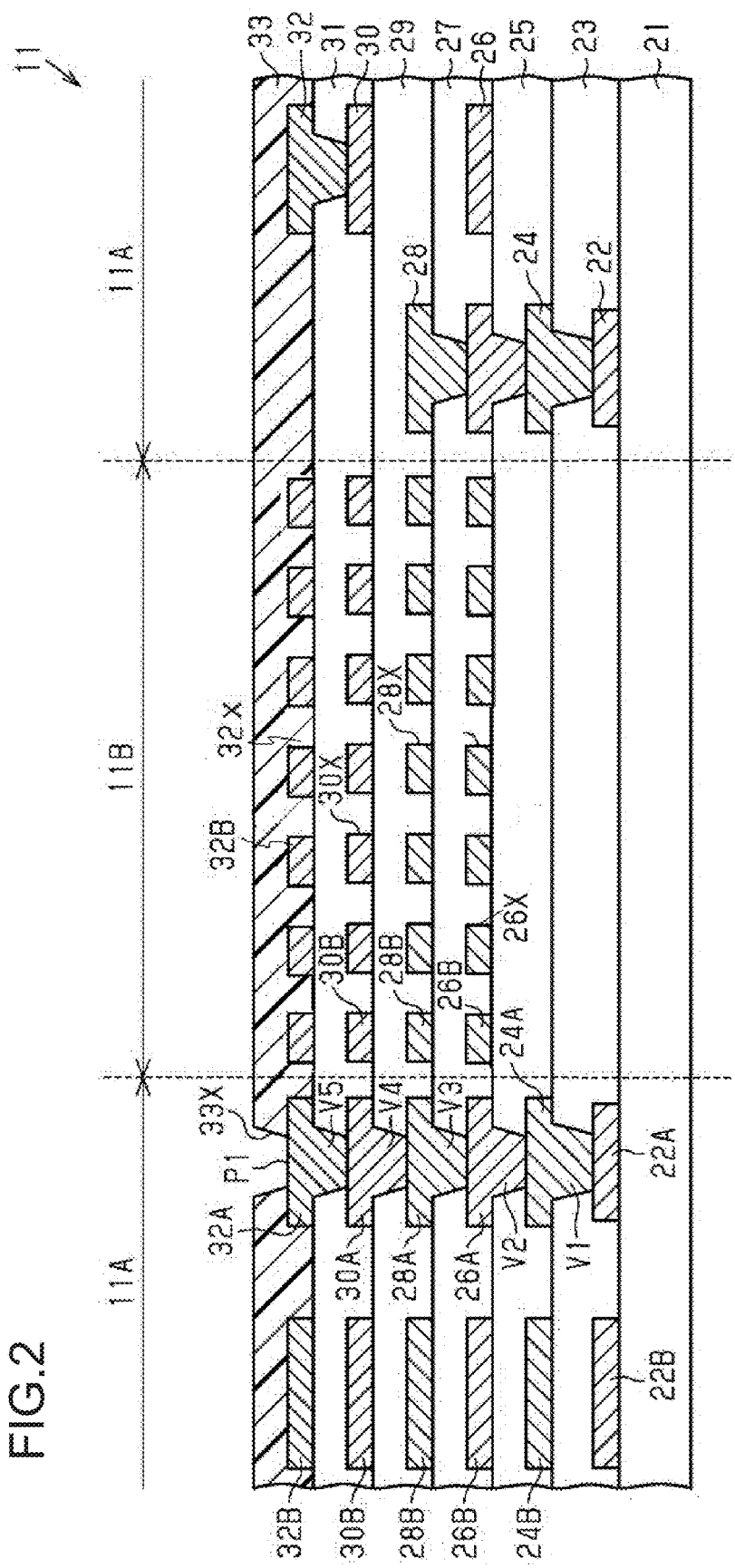
FIG. 2 is a schematic sectional view showing a wiring substrate according to the first embodiment (a sectional view taken along a line 2-2 in FIG. 1, FIG. 3 and FIGS. 4A to 4C)

As shown in FIG. 2, the wiring substrate 11 has a structure in which an insulating layer 21, a wiring layer 22, an insulating layer 23, a wiring layer 24, an insulating layer 25, a wiring layer 26, an insulating layer 27, a wiring layer 28, an insulating layer 29, a wiring layer 30, an insulating layer 31, a wiring layer 32, and a solder resist layer 33 are sequentially formed. Thus, the wiring substrate 11 according to the present embodiment has a form of a so-called coreless substrate free from a support substrate, differently from a wiring substrate manufactured by a general buildup method (i.e. a wiring substrate in which a required number of built-up layers are sequentially formed on one or each of opposite faces of a core substrate serving as a support substrate).

In the present embodiment, for convenience, the solder resist layer 33 side of the wiring substrate 11 is set as an upper side; the insulating layer 21 side of the wiring substrate 11, a lower side; faces of respective portions positioned on the solder resist layer 33 side, upper faces; and faces of respective portions positioned on the insulating layer 21 side, lower faces. Incidentally, the wiring substrate 11 can be used in a vertically inverted state or can be used at any angle. In addition, in the description of the present disclosure, the term "plan view" will mean a view of an object from a normal direction to an upper face of the solder resist layer 33 (or a lower face of the insulating layer 21), and the term "planar shape" will mean a shape of the object viewed from the normal direction to the upper face of the solder resist layer 33 (or the lower face of the insulating layer 21). In addition, the term "parallel" or "perpendicular" in the description of the present disclosure includes not only a strictly parallel or perpendicular case but also a substantially parallel or perpendicular case within a scope in which functions and effects in the present embodiment can be obtained.

For example, an insulating resin having a low Young's modulus and flexibility can be used as the material of the insulating layer 21, 23, 25, 27, 29, 31. For example, a non-photosensitive insulating resin containing a thermosetting resin such as an epoxy-based resin or a polyimide-based resin as a main component can be used as the material of the insulating layer 21, 23, 25, 27, 29, 31. In addition, for example, an insulating resin containing a photosensitive resin such as a phenol-based resin or a polyimide-based resin as a main component can be also used as the material of the insulating layer 21, 23, 25, 27, 29, 31. The insulating layer 21, 23, 25, 27, 29, 31 may, for example, contain a filler of silica, alumina, etc. Incidentally, the insulating layer 21, 23, 25, 27, 29, 31 can be, for example, made about 20 μm to 45 μm thick.

For example, copper (C) or a copper alloy can be used as the material of the wiring layer 22, 24, 26, 28, 30, 32. The wiring layer 22, 24, 26, 28, 30, 32 can be, for example, made about 10 μm to 20 μm thick. In addition, line and space (US) of the wiring layer 22, 24, 26, 28, 30, 32 can be, for example, set in a range of about 10 μm/10 μm to 20 μm/20 μm. Here, the line and space (L/S) expresses a width of each wiring and an interval between adjacent wirings.

The insulating layer 21 is formed as a lowermost layer of the wiring substrate 11. The wiring layer 22 is formed on an upper face of the insulating layer 21. The wiring layer 22 serves as a lowermost wiring layer of the wiring substrate 11. The wiring layer 22 has wiring patterns 22A each constituting a signal line or the like, and shield patterns 22B shielding noise such as electromagnetic noise. For example, each of the shield patterns 22B serves as a ground pattern connected to a not-shown ground power supply.

The insulating layer 23 is formed on the upper face of the insulating layer 21 so as to cover the wiring layer 22. The wiring layer 24 is formed on an upper face of the insulating layer 23. The wiring layer 24 is electrically connected to the wiring layer 22 through via wirings V1 penetrating the insulating layer 23 in a thickness direction. The wiring layer 24 is, for example, integrally formed with the via wirings V1. The wiring layer 24 has wiring patterns 24A each constituting a signal line or the like, and shield patterns 24B shielding noise such as electromagnetic noise. For example, each of the shield patterns 24B serves as a ground pattern connected to the not-shown ground power supply.

The insulating layer 25 is formed on the upper face of the insulating layer 23 so as to cover the wiring layer 24. The wiring layer 26 is formed on an upper face of the insulating layer 25. The wiring layer 26 is electrically connected to the wiring layer 24 through via wirings V2 penetrating the insulating layer 25 in the thickness direction. The wiring layer 26 is, for example, integrally formed with the via wirings V2. The wiring layer 26 has wiring patterns 26A each constituting a signal line or the like, and shield patterns 26B shielding noise such as electromagnetic noise. For example, each of the shield patterns 26B serves as a ground pattern connected to the not-shown ground power supply.

The insulating layer 27 is formed on the upper face of the insulating layer 25 so as to cover the wiring layer 26. The wiring layer 28 is formed on an upper face of the insulating layer 27. The wiring layer 28 is electrically connected to the wiring layer 26 through via wirings V3 penetrating the insulating layer 27 in the thickness direction. The wiring layer 28 is, for example, integrally formed with the via wirings V3. The wiring layer 28 has wiring patterns 28A each constituting a signal line or the like, and shield patterns 28B shielding noise such as electromagnetic noise. For example, each of the shield patterns 28B serves as a ground pattern connected to the not-shown ground power supply.

The insulating layer 29 is formed on the upper face of the insulating layer 27 so as to cover the wiring layer 28. The wiring layer 30 is formed on an upper face of the insulating layer 29. The wiring layer 30 is electrically connected to the wiring layer 28 through via wirings V4 penetrating the insulating layer 29 in the thickness direction. The wiring layer 30 is, for example, integrally formed with the via wirings V4. The wiring layer 30 has wiring patterns 30A each constituting a signal line or the like, and shield patterns 30B shielding noise such as electromagnetic noise. For example, each of the shield patterns 30B serves as a ground pattern connected to the not-shown ground power supply.

The insulating layer 31 is formed on the upper face of the insulating layer 29 so as to cover the wiring layer 30. The wiring layer 32 is formed on an upper face of the insulating layer 31. The wiring layer 32 is electrically connected to the wiring layer 30 through via wirings V5 penetrating the insulating layer 31 in the thickness direction. The wiring layer 32 is, for example, integrally formed with the via wirings V5. The wiring layer 32 has wiring patterns 32A each constituting a signal line etc., and shield patterns 32B shielding noise such as electromagnetic noise. For example, each of the shield patterns 32B serves as a ground pattern connected to the not-shown ground power supply.

Here, each of the via wirings V1, V2, V3, V4, V5 is, for example, formed into a tapered shape having a width decreasing from the upper side (the solder resist layer 33 side) toward the lower side (the insulating layer 21 side) in FIG. 2. The via wiring V1, V2, V3, V4, V5 is, for example, formed into an approximately inverted truncated conical shape in which a lower face is smaller than an upper face. The diameter of the upper face of the via wiring V1, V2, V3, V4, V5 can be, for example, set in a range of about 60 μm to 70 μm.

The solder resist layer 33 is formed on the upper face of the insulating layer 31 so as to cover the wiring layer 32. For example, an insulating resin containing a photosensitive resin such as a phenol-based resin or a polyimide-based resin as a main component can be used as the material of the solder resist layer 33. The solder resist layer 33 may, for example, contain a filler of silica, alumina, etc. In addition, the material of the solder resist layer 33 is not limited to the insulating resin containing the photosensitive resin as a main component but may, for example, use the same insulating resin as the insulating layer 21, 23, 25, 27, 29, 31. The solder resist layer 33 can be, for example, made about 15 μm to 35 μm thick.

A plurality of opening sections 33x are formed in the solder resist layer 33 in order to penetrate the solder resist layer 33 in the thickness direction to expose portions of an upper face of the wiring layer 32 as connection pads P1. For example, the connection pads P1 function as pads electrically connected to connection terminals of the electronic components shown in FIG. 1. Each of the electronic components 12 is, for example, mounted on the upper face side of the solder resist layer 33.

A surface treatment layer is formed on the wiring layer 32 (i.e. on the connection pads P1) exposed from the opening sections 33X if occasions demand. Examples of the surface treatment layer may include a gold (Au) layer, a nickel (Ni) layer/Au layer (a metal layer in which an Ni layer and an Au layer are formed in the named order), an Ni layer/palladium (Pd) layer/Au layer (a metal layer in which an Ni layer, a Pd layer and an Au layer are formed in the named order) etc. Here, the Au layer is a metal layer made of Au or an Au alloy, the Ni layer is a metal layer made of Ni or an Ni alloy, and the Pd layer is a metal layer made of Pd or a Pd alloy. For example, a metal layer (an electroless metal plating layer) formed by an electroless plating method can be used as each of the Ni layer, the Au layer and the Pd layer. In addition, an OSP film formed by applying antioxidation treatment such as OSP (Organic Solderability Preservative) treatment on the surfaces of the connection pads P1 can be used as another example of the surface treatment layer. An organic coating of an azole compound, an imidazole compound, or the like can be used as the OSP film.

In the wiring substrate 11 in the present example, the number of wiring layers in each of the non-mounting regions 11B is smaller than the number of wiring layers in each of the mounting regions 11A. To give detailed description, the wiring layers 22 and 24 are disposed in only the mounting region 11A. That is, the wiring layers 22 and 24 are not disposed in the non-mounting region 11B. In addition, the wiring layers 26, 28, 30 and 32 are disposed in both the mounting region 11A and the non-mounting region 11B. Therefore, in the wiring substrate 11 in the present example, the number of the wiring layers in the non-mounting region 11B is four, i.e. the wiring layers 26, 28, 30 and 32. On the other hand, the number of the wiring layers in the mounting region 11A is six, i.e. the wiring layers 22, 24, 26, 28, 30 and 32. Thus, the number of the wiring layers in the non-mounting region 11B is made smaller than the number of the wiring layers in the mounting region 11A. Thus, it is possible to reduce a formation density of the wiring layers in the non-mounting region 11B to thereby secure excellent bendability.

The via wirings V1, V2, V3, V4 and V5 in the present example are disposed in only the mounting region 11A. That is, the via wirings V1, V2, V3, V4 and V5 are not disposed in the non-mounting region 11B in the present example. Thus, the via wirings V1, V2, V3, V4 and V5 are not disposed in the non-mounting region 11B which is configured bendably, and the via wirings V1, V2, V3, V4 and V5 are disposed in only the mounting region 11A which is assumed not to be bent. Thus, conduction failure caused by peeling etc. of the via wirings V1, V2, V3, V4 and V5 can be suitably suppressed from occurring when the non-mounting region 11B is folded (bent).

On the other hand, the wiring patterns 22A, 24A, 26A, 28A, 30A and 32A may be disposed in one of the mounting region 11A and the non-mounting region 11B. The wiring substrate 11 in the present example uses a form in which the wiring layers 22 and 24 are not formed in the non-mounting region 11B. Accordingly, the wiring patterns 22A and 24A are not formed in the non-mounting region 11B. In addition, in, of the wiring layers 26, 28, 30 and 32 disposed in the non-mounting region 11B, the wiring layers 26 and 32 positioned in the outermost layers, it is preferable that the wiring patterns 26A and 32A are not formed in the non-mounting region 11B. This is because shield patterns covering the wiring patterns 26A and 32A from the outside cannot be formed when the wiring patterns 26A and 32A are formed in the non-mounting region 11B. Incidentally, in the wiring substrate 11 in the present example, for example, the wiring pattern 28A in the wiring layer 28 is formed in each the mounting region 11A and the non-mounting region 11B.

The shield patterns 22B, 24B, 26B, 28B, 30B and 32B may be disposed in one of the mounting region 11A and the non-mounting region 11B. The wiring substrate 11 in the present example has the form in which the wiring layers 22 and 24 are not formed in the non-mounting region 11B. Accordingly, the shield patterns 22B and 24B are not formed in the non-mounting region 11B. In the wiring substrate 11 in the present example, for example, the shield patterns 26B, 28B, 30B and 32B in the wiring layers 26, 28, 30 and 32 are formed in each of the mounting region 11A and the non-mounting region 11B.

A plurality of through holes 26X, 28X, 30X and 32X thicknesswise penetrating the shield patterns 26B, 28B, 30B and 32B disposed in the non-mounting region 11B are formed respectively in the shield patterns 26B, 28B, 30B and 32B.

Figure 3:
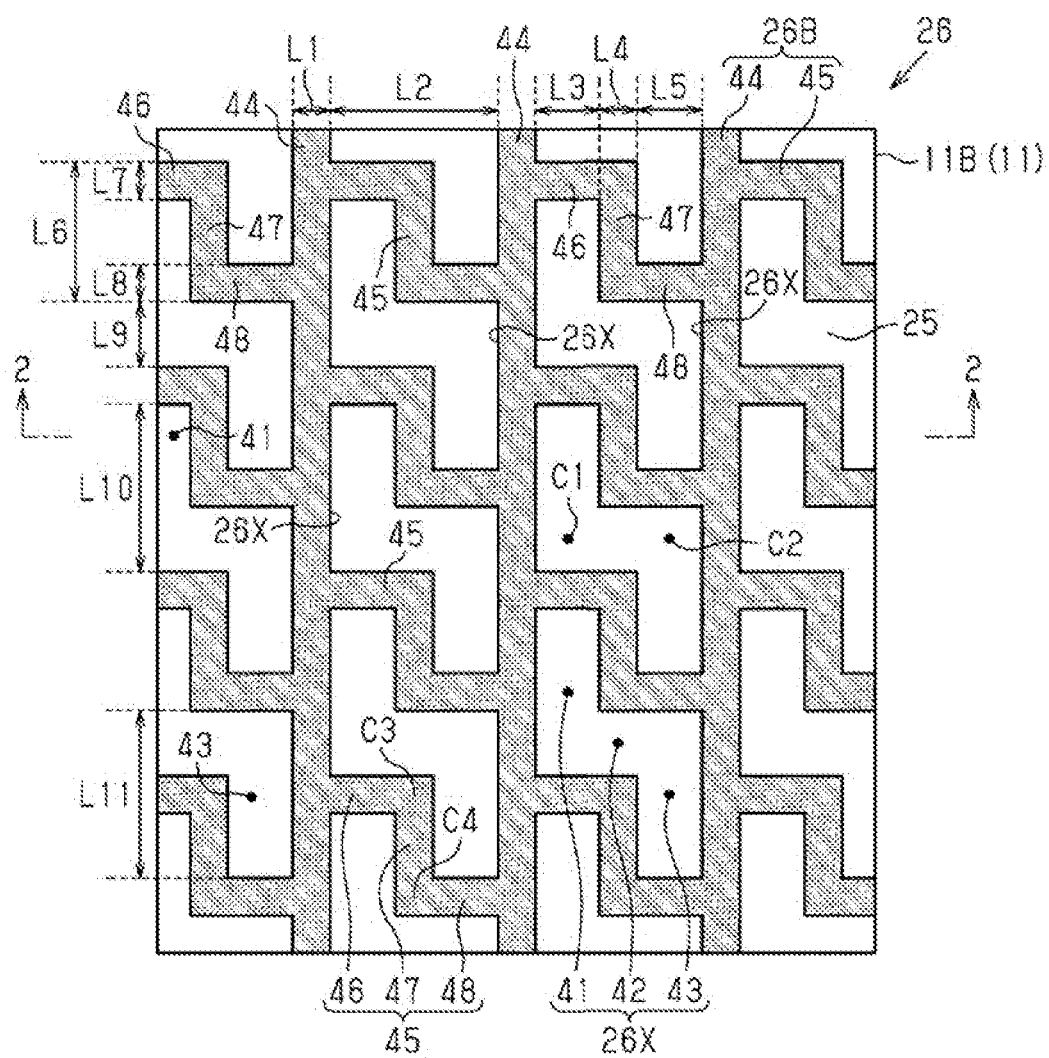
FIG. 3 is a schematic sectional view showing the wiring substrate according to the first embodiment.

Next, structures of the wiring layers 26, 28, 30 and 32 disposed in the non-mounting region 11B will be described in detail in accordance with FIG. 3 and FIGS. 4A to 4C. Incidentally, FIG. 3 and FIG. 4A show a planar shape of the wiring layer 26 disposed in the non-mounting region 11B. In addition, FIG. 4B shows a planar shape of the wiring layer 28 disposed in the non-mounting region 11B. FIG. 4C shows a planar shape of the wiring layer 30 disposed in the non-mounting region 11B. Incidentally, FIGS. 4A to 4C respectively show the planar shapes of the wiring layers 26, 28 and 30 at the same planar positions as one another.

As shown in FIG. 3, the wiring layer 26 disposed in the non-mounting region 11B has the shield pattern 26B in which a plurality of through holes 26X are formed. The plurality of through holes 26X are arranged at predetermined intervals. For example, the plurality of through holes 26X are provided at the predetermined intervals in the bending direction, and provided at the predetermined intervals in a direction (the short direction of the wiring substrate 11 in the present embodiment) perpendicular to the bending direction in plan view.

Each of the through holes 26X is formed into a shape having at least one bent portion in plan view. The through hole 26X in the present example is formed into a crank shape having two bent portions C1 and C2 in plan view. To give detailed description, the through hole 26X has an opening section 41, an opening section 42 and an opening section 43. The opening section 41 extends along the short direction perpendicular to the bending direction. The opening section 42 extends from an end of the opening section 41 and along the bending direction. The opening section 43 extending from an end of the opening section 42 and along the short direction is formed at a position shifted from the opening section 41 in the short direction. The opening section 41 and the opening section 43 are, for example, formed into the same planar shape and the same size as each other. The plurality of through holes 26X are, for example, formed into the same planar shape and the same size as one another. In addition, the plurality of through holes 26X are, for example, disposed to face in the same direction as one another. The shield pattern 26B is defined as an approximate grating pattern by the plurality of through holes 26X.

For example, the shield pattern 26B has a plurality of support portions 44 and a plurality of coupling portions 45. The support portions 44 each extending along a predetermined direction (an example of a second direction) are formed in parallel with one another. Each of the coupling portions 45 is formed between adjacent ones of the support portions 44 so as to connect the adjacent support portions 44 to each other. The coupling portions 45 are, for example, formed continuously and integrally with the support portions 44.

Each of the support portions 44 is, for example, formed to extend in a direction intersecting the bending direction in plan view. The support portion 44 in the present example is formed to extend in a direction (the short direction of the wiring substrate 11 here) perpendicular to the bending direction (the long direction of the wiring substrate 11 here) in plan view. The support portion 44 is, for example, formed to extend in a linear shape with a predetermined width. The support portions 44 are, for example, provided at predetermined intervals in the bending direction. In the example shown in FIG. 3, three support portions 44 are provided, but the number of the support portions 44 is not limited particularly. Two support portions 44 are provided, or four or more support portions 44 are provided.

A plurality of coupling portions 45 are, for example, provided at predetermined intervals in the short direction of the wiring substrate 11 between adjacent ones of the support portions 44. A plurality of coupling portions 45 are, for example, provided at predetermined intervals in the bending direction. In the present example, the plurality of coupling portions 45 provided to be arranged side by side along the bending direction are provided to be arranged side by side at the same positions in the short direction. In addition, the plurality of coupling portions 45 are, for example, formed into the same planar shape and the same size as one another. The plurality of coupling portions 45 are, for example, disposed to face in the same direction as one another.

Each of the coupling portions 45 is formed into a shape having at least one bent portion in plan view. The coupling portion 45 in the present example is formed into a crank shape having two bent portions C3 and C4 in plan view. To give detailed description, the coupling portion 45 has an extending section 46, a connecting section 47 and an extending section 48. The extending section 46 extends along the bending direction. The connecting section 47 extends from an end of the extending section 46 and along the short direction perpendicular to the bending direction. The extending section 48 extends from an end of the extending section 47 and along the bending direction. That is, in the coupling portion 45, the connecting section 47 is formed to bend substantially at right angles to the extending section 46, and the extending section 48 is formed to bend substantially at right angles to the connecting section 47. In the coupling portion 45, the bent portion C3 is formed at a connecting part between the extending section 46 and the connecting section 47, and the bent portion C4 is formed in a connecting part between the connecting section 47 and the extending section 48. In the coupling portion 45, the extending section 46 and the extending section 48 are provided at positions shifted from each other in the short direction. The extending section 46 and the extending section 48 are, for example, formed into the same planar shape and the same size as each other. An end of the extending section 46 is connected to one support portion 44 of the adjacent support portions 44, and an end of the extending section 48 is connected to the other support portion 44 of the adjacent support portions 44. For example, the adjacent support portions 44, the extending section 46, the connecting section 47 and the extending section 48 are formed continuously and integrally with one another.

Thus, in the shield pattern 26B, the coupling portion 45 formed between the adjacent support portions 44 is formed into the shape having the bent portions C3 and C4 in plan view. Thus, since the coupling portion 45 can be made to have springiness, excellent bendability can be secured due to the springiness.

Here, a bending-direction length L1 of each of the support portions 44 (i.e. a width of the support portion 44) can be, for example, set in a range of about 25 to 100 µm. A spacing distance L2 between the adjacent support portions 44 in the bending direction can be, for example, set in a range of about 225 to 400 µm. A bending-direction length L3 of the extending section 46 can be, for example, set in a range of about 100 to 150 µm. A bending-direction length L4 of the connecting section 47 (i.e. a width of the connecting section 47) can be, for example, set in a range of about 25 to 100 µm. A bending-direction length L5 of the extending section 48 can be, for example, set in a range of about 100 to 150 µm. A short-direction entire length L6 of the coupling portion 45 as a whole (i.e. a short-direction length of the connecting section 47) can be, for example, set in a range of about 100 to 350 µm. A short-direction length L7 of the extending section 46 (i.e. a width of the extending section 46) can be, for example, set in a range of about 25 to 100 µm. A short-direction length L8 of the extending section 48 (i.e. a width of the extending portion 48) can be, for example, set in a range of about 25 to 100 µm. A spacing distance L9 between the adjacent coupling portions 45 in the short direction can be, for example, set in a range of about 100 to 150 µm. A spacing distance L10 between the adjacent extending sections 46 in the short direction (i.e. a short-direction length of the opening section 41 of the through hole 26X) can be, for example, set in a range of about 175 to 400 µm. A spacing distance L11 between the adjacent extending portions 48 in the short direction (i.e. a short-direction length of the opening section 43 of the through hole 26X) can be, for example, set in a range of about 175 to 400 µm. The aforementioned dimensions of the respective members can be set suitably based on shield performance and a bending elastic modulus requested of the shield pattern 26B.

In the present embodiment, the width L1 of the support portion 44, the width L4 of the connecting section 47, the width L7 of the extending section 46 and the with L8 of the extending section 48 are set to be the same lengths as one another. In addition, in the present embodiment, the spacing distance L2 between the adjacent support portions 44 in the bending direction is set to be longer than the spacing distance L10 between the adjacent extending sections 46 in the short direction (or the spacing distance L11 between the adjacent extending sections 48 in the short direction). Thus, since the interval between the adjacent support portions 44 having a higher rigidity structure than the coupling portions 45 can be secured more widely, excellent bendability can be secured.

As shown in FIG. 4B, the wiring layer 28 disposed in the non-mounting region 11B has wiring patterns 28A and a shield pattern 28B. Each of the wiring patterns 28A is, for example, formed to extend along the bending direction. In the present example, each of two wiring patterns 28A is, for example, formed to extend along the bending direction. The two wiring patterns 28A are, for example, formed to be parallel with each other. The shield pattern 28B is, for example, formed to put the wiring patterns 28A between opposite sides in the short direction. The through holes 28X having the same planar shape as the through holes 26X (see FIG. 4A) are formed in the shield pattern 28B. The through holes 28X are, for example, formed into the same size as the through holes 26X, and arranged at the same intervals as the through holes 26X. In the present embodiment, the through holes 26X and 28X adjacent in a layering direction (an up/down direction in FIG. 2) are formed to overlap each other respectively in plan view. The shield pattern 28B has support portions 54 and coupling portions 55 defined by the through holes 28X. The support portions 54 and the coupling portions 55 have the same shapes as the support portions 44 and the coupling portions 45 respectively.

As shown in FIG. 4C, the through holes 30X having the same planar shape as the through holes 26X (see FIG. 4A) are formed in the shield pattern 30B belonging to the wiring layer 30. The through holes 30X are, for example, formed to have the same size as the through holes 26X, and arranged at the same intervals as the through holes 26X. In the present embodiment, the through holes 28X and 30X adjacent in the layering direction are formed to overlap each other respectively in plan view. The shield pattern 30B has support portions 64 and coupling portions 65 which are defined by the through holes 30X. The support portions 64 and the coupling portions 65 have the same shapes as the support portions 44 and the coupling portions 45 respectively.

As designated by a broken line in FIG. 4B, the shield pattern 26B adjacent to the wiring patterns 28A in the layering direction is formed to overlap the wiring patterns 28A in plan view. For example, the support portions 44 of the shield pattern 26B are formed to cross the wiring patterns 28A in plan view. For example, the coupling portions 45 of the shield pattern 26B are formed so that the connecting sections 47 extending in the short direction cross the wiring patterns 28A in plan view. The connecting sections 47 in the present example are formed to cross one wiring pattern 28A of the two wiring patterns 28A. In a similar manner or the same manner, the shield pattern 30B adjacent to the wiring patterns 28A in the layering direction is also formed to overlap the wiring pattern 28A in plan view.

Incidentally, although not shown, the through holes 32x having the same planar shape as the through holes 26X are formed in the shield pattern 32B belonging to the wiring layer 32 shown in FIG. 2. The through holes 32X are, for example, formed to have the same shape as the through holes 26X, and arranged at the same intervals as the through holes 26X. In the present embodiment, the through holes 30X and 32X adjacent in the layering direction are formed to overlap each other respectively in plan view.

Each of the shield patterns 26B, 28B, 30B and 32B disposed in the non-mounting region 11B has an area large enough to maintain desired shield performance requested of the shield pattern 26B, 28B, 30B, 32B. When the material of the shield pattern 26B, 28B, 30B, 32B is copper, a remaining copper rate of the shield pattern 26B, 28B, 30B, 32B disposed in the non-mounting region 11B can be set desirably within a range in which the desired shield performance can be maintained. For example, the remaining copper rate of the shield pattern 26B, 28B, 30B, 32B disposed in the non-mounting region 11B can be set in a range of about 30 to 40%. Here, the remaining copper rate means a ratio of the area of the copper layer to an area on a certain insulating layer.

Next, a manufacturing method of the wiring substrate 11 will be described in accordance with FIG. 5A to FIG. 10. An example of a process of manufacturing a plurality of wiring substrates one by one on a support substrate and then removing the support substrate will be shown in the present embodiment. However, the process may be arranged so that a portion serving as a plurality of wiring substrates is manufactured on a support substrate, and then separated into individual wiring substrates after the support substrate is removed. Incidentally, for convenience of explanation, portions which will finally serve as constituent elements of the wiring substrate 11 will be described with signs as the final constituent elements respectively.

Figure 5A:
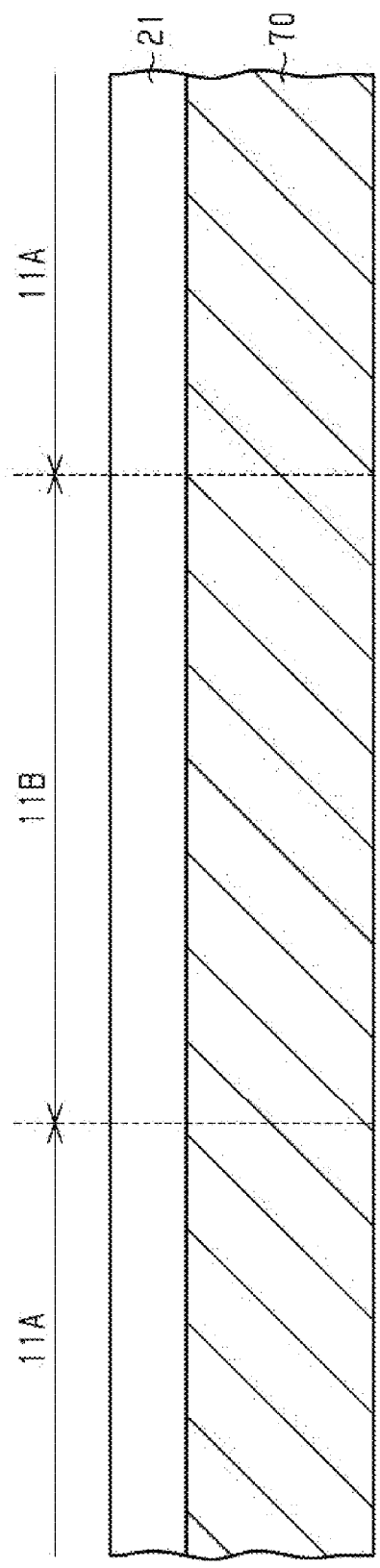
FIGS. 5A and 5B are schematic sectional views showing a manufacturing method of the wiring substrate according to the first embodiment.

As shown in FIG. 5A, first, a support substrate 70 is prepared. As the support substrate 70, for example, a metal plate or a metal foil can be used. In the present embodiment, for example, a copper foil is used. The support substrate 70 can be, for example, made about 18 to 100 µm thick.

Successively, an insulating layer 21 is formed on an upper face of the support substrate 70 to cover the whole of the upper face of the support substrate 70. When a resin film is used as the insulating layer 21, for example, the insulating layer 21 can be formed by laminating the resin film on the support substrate 70, and then curing the resin film by heat treatment at a temperature of about 130 to 190° C. while pressing the resin film. In addition, the insulating layer 21 may be formed by applying a liquid or paste-like insulating resin to the upper face of the support substrate 70 by a spin coating method etc., and curing the applied insulating resin by heat treatment at a temperature of about 130 to 190° C.

Figure 5B:
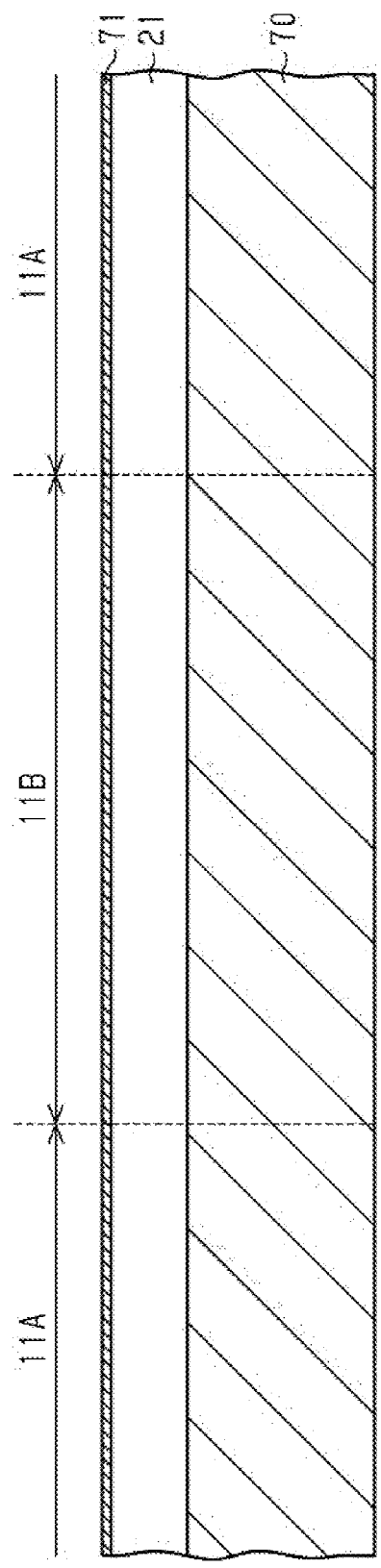

Next, in a step shown in FIG. 5B, a seed layer 71 is formed on an upper face of the insulating layer 21 to cover the whole of the upper face of the insulating layer 21. The seed layer 71 can be, for example, formed by an electroless plating method (e.g. an electroless copper plating method) or a sputtering method.

Next, in a step shown in FIG. 6A, a resist layer 72 having opening patterns 72X is formed on an upper face of the seed layer 71. The opening patterns 72X are formed to expose portions of the upper face of the seed layer 71 corresponding to regions where a wiring layer 22 (see FIG. 2) should be formed. For example, a photosensitive dry film, a liquid photoresist (e.g. a dry film or a liquid resist made of a novolac-based resin, an acrylic-based resin, or the like), or the like, can be used as the material of the resist layer 72. When, for example, the photosensitive dry film is used, the dry film is laminated on the upper face of the insulating layer 21 by thermocompression bonding, and the dry film is patterned by photolithography to thereby form the resist layer 72. Incidentally, also when the liquid photoresist is used, the resist layer 72 can be formed via a similar step or the same step.

Successively, in a step shown in FIG. 6B, an electrically conductive layer 73 is formed on the upper face of the seed layer 71 exposed from the opening patterns 72X of the resist layer 72. For example, the upper face of the seed layer 71 exposed from the opening patterns 72X is plated with the resist layer 72 as a plating mask by an electrolytic plating method (e.g. an electrolytic copper plating method) using the seed layer 71 as a plating power feed layer, so that the electrically conductive layer 73 is formed on the seed layer 71.

Figure 7A:
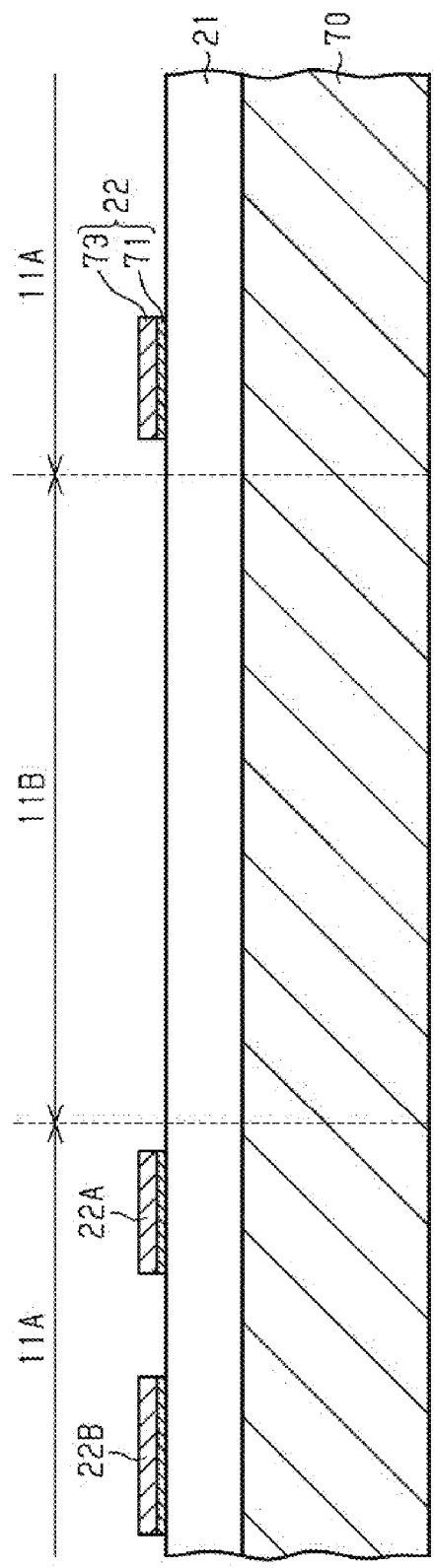
FIGS. 7A and 7B are schematic sectional views showing the manufacturing method of the wiring substrate according to the first embodiment.

Next, the resist layer 72 is removed by an alkaline stripping solution (e.g. an organic amine-based stripping solution, caustic soda, acetone, ethanol, etc.). Next, in a step shown in FIG. 7A, an unnecessary portion of the seed layer 71 is removed by etching with the electrically conductive layer 73 as an etching mask. When the seed layer 71 is an electroless copper plating layer, the unnecessary portion of the seed layer 71 is removed, for example, by wet etching using a sulfuric acid/hydrogen peroxide-based etching solution. Thus, a wiring layer 22 consisting of the seed layer 71 and the electrically conductive layer 73 is formed. The wiring layer 22 has wiring patterns 22A, and shield patterns 22B provided in only mounting regions 11A. The wiring layer 22 is not formed in non-mounting regions 11B. Incidentally, in FIGS. 7B to 11 following FIG. 7A, illustration of the seed layer 71 and the electrically conductive layer 73 will be omitted but illustrated as the wiring layer 22 (or a wiring layer 22A, 22B).

Figure 7B:
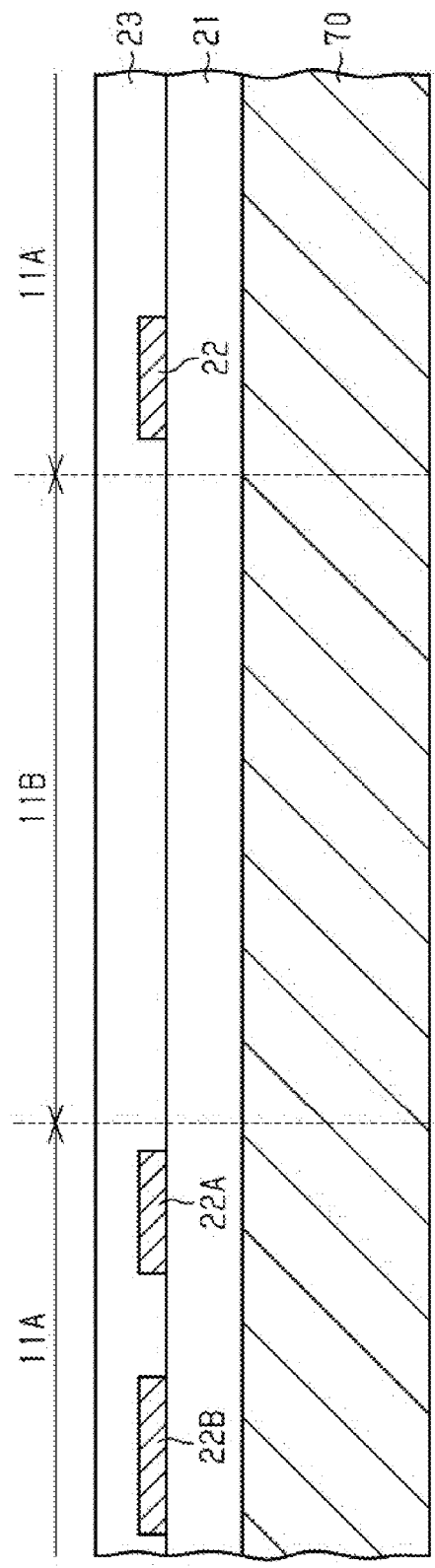

Successively, in a step shown in FIG. 7B, an insulating layer 23 is formed on an upper face of the insulating layer 21 so as to cover the wiring layer 22. The insulating layer 23 can be, for example, formed by a similar method to or the same method as the insulating layer 21.

Figure 8A:
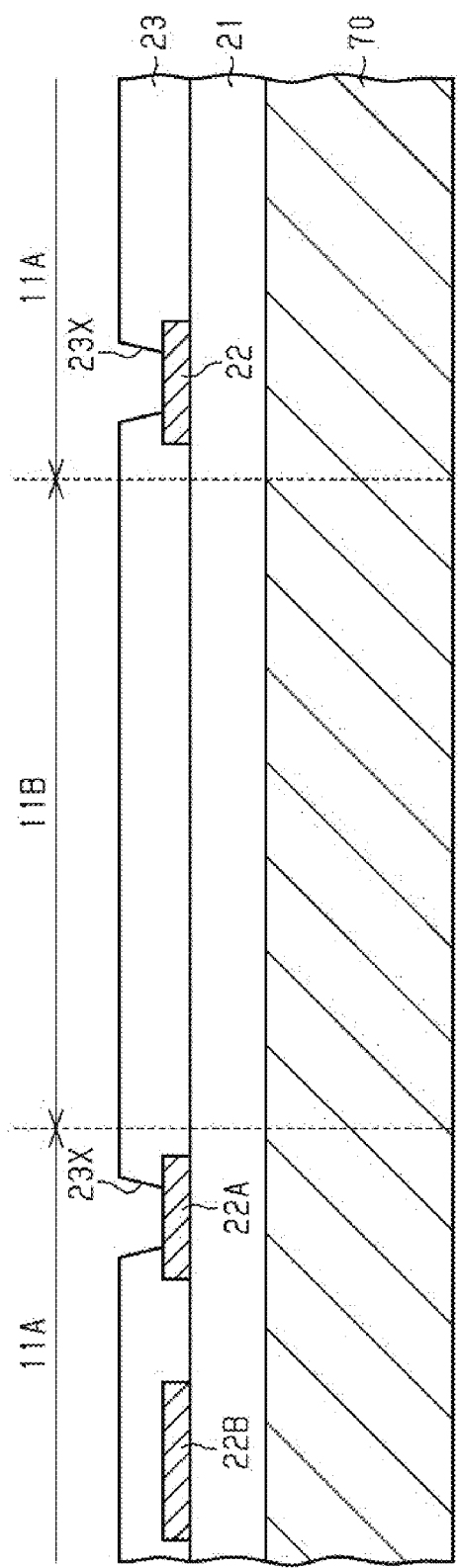
FIGS. 8A and 8B are schematic sectional views showing the manufacturing method of the wiring substrate according to the first embodiment.

Next, in a step shown in FIG. 8A, via holes 23X are formed in the insulating layer 23 to penetrate the insulating layer 23 in a thickness direction so as to expose portions of an upper face of the wiring layer 22. The via holes 23X are formed in only the mounting regions 11A. The via holes 23X can be, for example, formed by a laser machining method by a $CO_2$ laser, a YAG laser, or the like. Incidentally, when the insulating layer 23 is formed out of a photosensitive resin, the required via holes 23X may be, for example, formed in the insulating layer 23 by photolithography.

Next, in a case where the via holes 23X have been formed by the laser machining method, desmear treatment is performed to remove resin smears (resin residues) stuck to the exposed face of the wiring layer 22 exposed in bottom portions of the via holes 23X.

Figure 8B:
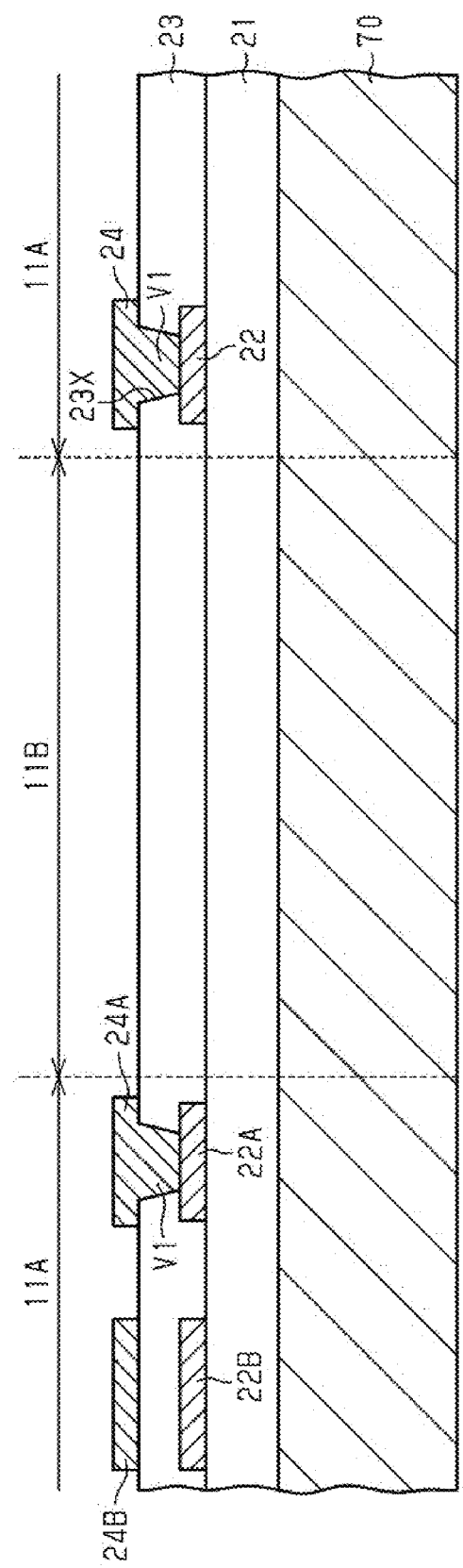

Successively, in a step shown in FIG. 8B, the via holes 23X are filled with via conductors to form via wirings V1, and a wiring layer 24 electrically connected to the wiring layer 22 through the via wirings V1 is formed on an upper face of the insulating layer 23. The wiring layer 24 has wiring patterns 24A and shield patterns 24B. The shield patterns 24B are provided in only the mounting regions 11A. Incidentally, the wiring layer 24 is not formed in the non-mounting regions 11B. The via wirings V1 and the wiring layer 24 can be, for example, formed by use of one of various wiring forming methods such as a semi-additive method and a subtractive method.

Figure 9:
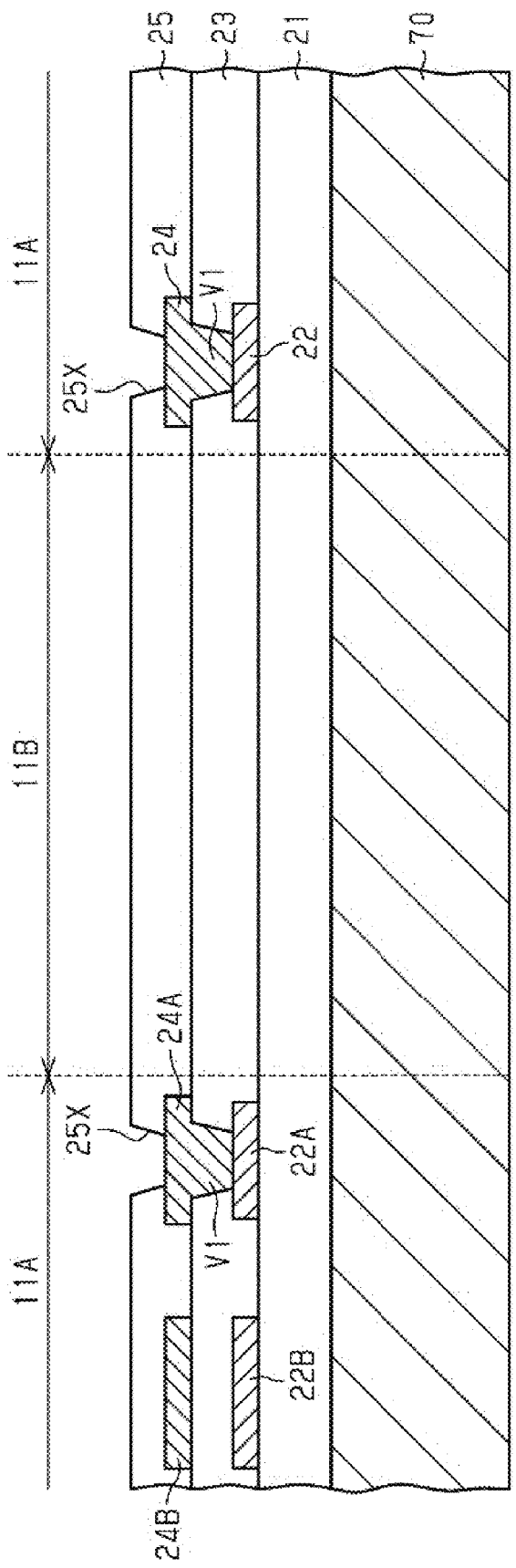
FIG. 9 is a schematic sectional view showing the manufacturing method of the wiring substrate according to the first embodiment.

Next, in a step shown in FIG. 9, an insulating layer 25 having via holes 25X exposing portions of an upper face of the wiring layer 24 is formed on the upper face of the insulating layer 23 in a manner similar to or the same as the steps shown in FIG. 7B and FIG. 8A.

Figure 10:
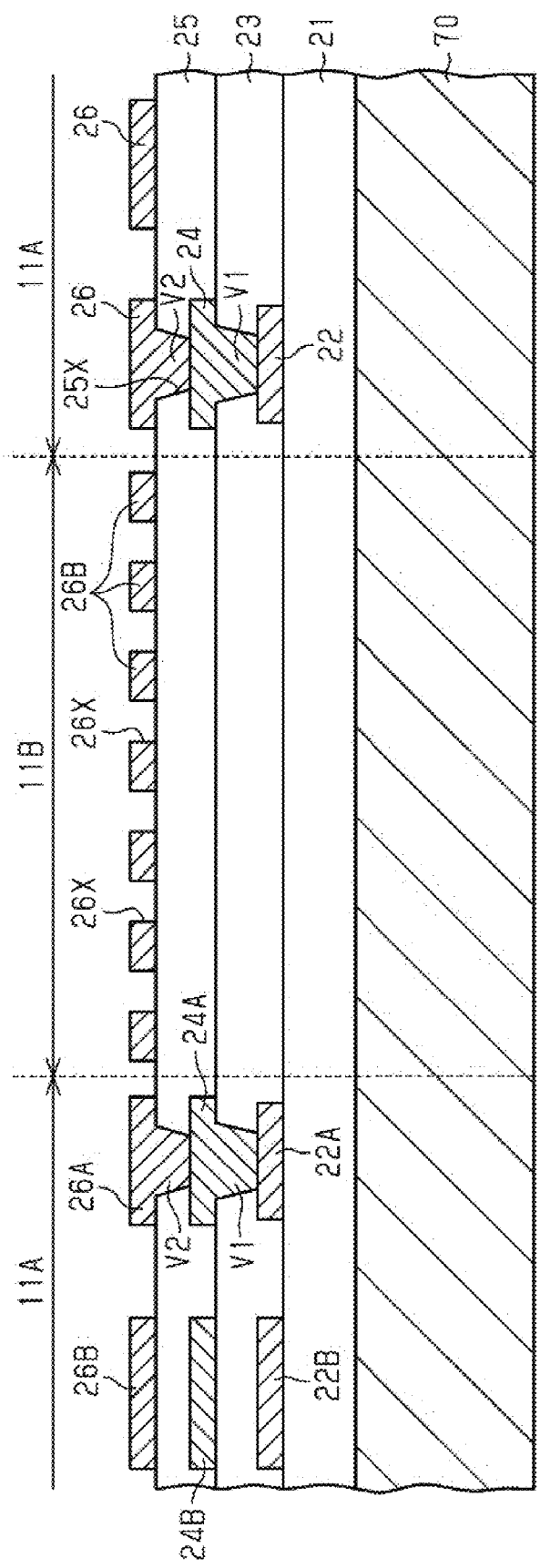
FIG. 10 is a schematic sectional view showing the manufacturing method of the wiring substrate according to the first embodiment.

Next, in a step shown in FIG. 10, the via holes 25X are filled with via conductors to form via wirings V2 in a manner similar to or the same as the step shown in FIG. 8B, and a wiring layer 26 electrically connected to the wiring layer 24 through the via wirings V2 is formed on an upper face of the insulating layer 25. The wiring layer 26 has wiring patterns 26A and shield patterns 26B. The shield patterns 26B are provided in both the mounting regions 11A and the non-mounting regions 11B. On this occasion, a plurality of through holes 26X having bent portions C1 and C2 (see FIG. 3) are formed in the shield patterns 26B provided in the non-mounting regions 11B.

Figure 11:
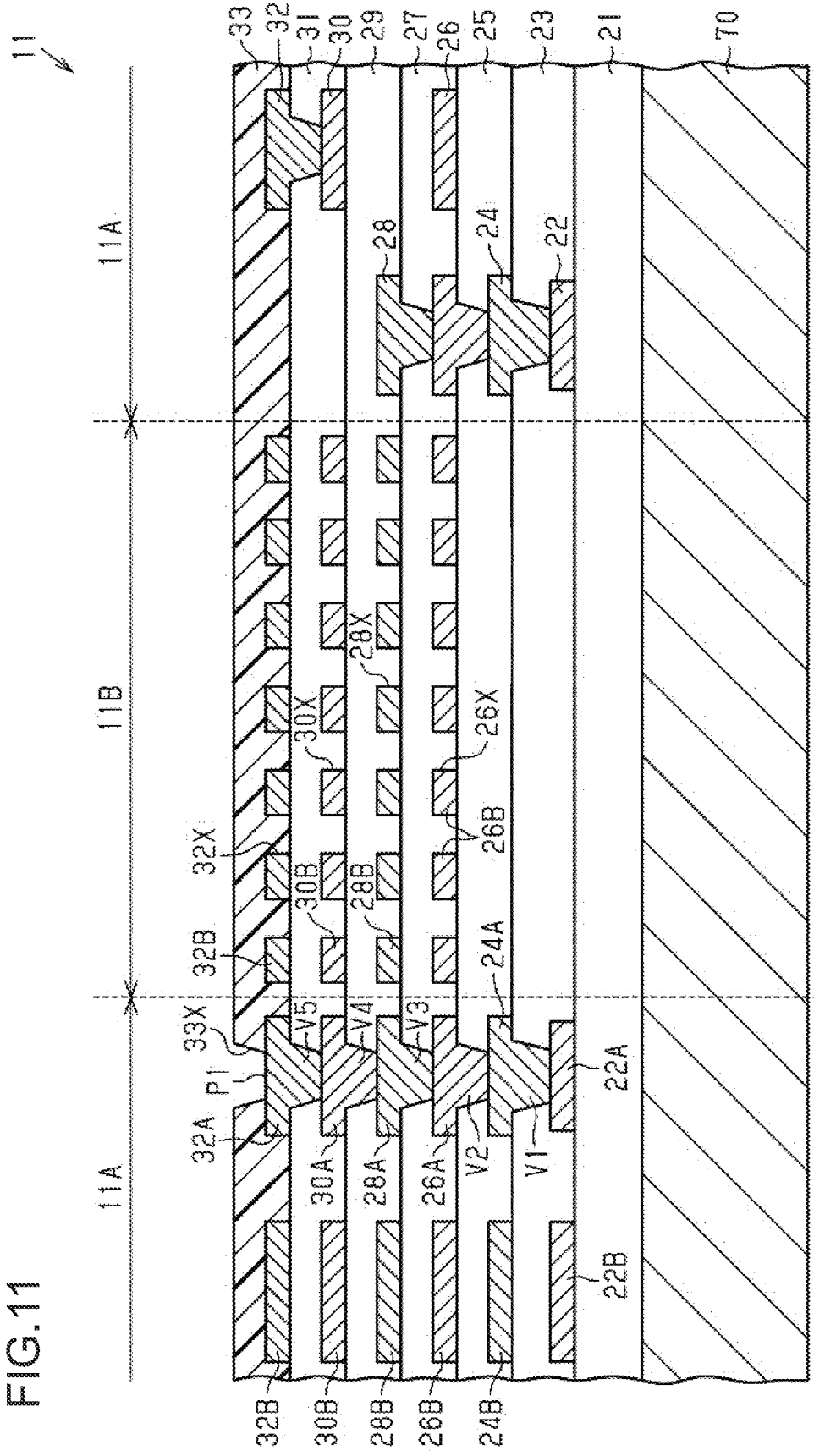
FIG. 11 is a schematic sectional view showing the manufacturing method of the wiring substrate according to the first embodiment.

Successively, in a step shown in FIG. 11, steps similar to or the same as the steps shown in FIG. 9 and FIG. 10 are performed repetitively to sequentially form an insulating layer 27, a wiring layer 28, an insulating layer 29, a wiring layer 30, an insulating layer 31, and a wiring layer 32.

Next, a solder resist layer 33 having opening sections 33X for exposing portions of an upper face of the wiring layer 32 as connection pad P1 is formed on an upper face of the insulating layer 31. The solder resist layer 33 can be, for example, formed by laminating a photosensitive solder resist film or applying a liquid solder resist and patterning the resist by photolithography. Incidentally, a surface treatment layer may be formed on the connection pads P1 if occasions demand.

Then, the support substrate 70 is removed. Thus, the wiring substrate 11 shown in FIG. 1 and FIG. 2 can be manufactured. In the case where the copper foil is used as the support substrate 70, the support substrate 70 can be, for example, removed by wet etching using a ferric chloride aqueous solution, a cupric chloride aqueous solution, an ammonium persulphate aqueous solution, etc. Incidentally, the step of forming the solder resist layer 33 may be performed after the step of removing the support substrate 70.

Next, effects and functions of the present embodiment will be described as follows.

(1) The plurality of through holes 26X are arranged at the predetermined intervals in the shield pattern 26B disposed in each of the non-mounting regions 11B. Each of the through holes 26X is formed into the shape having the bent portions C1 and C2 in plan view. Thus, in comparison with a case where a shield pattern is a solid pattern free from any through hole, a bending elastic modulus of the shield pattern 26B can be reduced, and a bending elastic modulus of the non-mounting region 11B can be reduced. As a result, bendability in the non-mounting region 11B can be improved.

(2) In addition, when the plurality of through holes 26X are formed in the shield pattern 26B, bent portions (the bent portions C3 and C4 in the present embodiment) are also formed in the shield pattern 26B defined by the plurality of through holes 26X. Since the shield pattern 26B having the bent portions can be made to have springiness, excellent bendability can be secured due to the springiness.

(3) The shield pattern 26B is formed into a structure in which the shield pattern 26B has the plurality of support portions 44 which extend along a predetermined direction (the direction perpendicular to the bending direction in the present embodiment) and which are formed in parallel with one another, and the coupling portions 45 each of which is formed between adjacent ones of the support portions 44. Further, each of the coupling portions 45 is formed into the shape having the bent portions C3 and C4 in plan view. Thus, since the coupling portions 45 are made to have springiness, excellent bendability can be secured due to the springiness.

(4) Each of the support portions 44 is formed to extend in the direction perpendicular to the bending direction. According to the configuration, the support portions 44 having a higher rigidity structure than the coupling portions 45 are formed to extend in the direction perpendicular to the bending direction. Therefore, the bendability of the non-mounting region 11B can be suitably suppressed from being hindered by the support portions 44.

(5) The coupling portions 45 are formed to extend along the bending direction as a whole. According to the configuration, the coupling portions 45 having a lower rigidity structure than the support portions 44 and having the springiness are formed to extend along the bending direction. Therefore, the bending elastic modulus of the non-mounting region 11B can be reduced effectively, and the bendability in the non-mounting region 11B can be improved more greatly.

(6) The through holes 26X, 28X, 30X and 32X provided in the shield patterns 26B, 28B, 30B and 32B adjacent to one another in the layering direction in the non-mounting section 11B are formed to overlap one another in plan view. According to the configuration, the through holes 26X, 28X, 30X and 32X adjacent to one another in the layering direction overlap one another respectively in plan view. Accordingly, gas can be easily evacuated through the through holes 26X, 28X, 30X and 32X. Therefore, the through holes 26X, 28X, 30X and 32X can be made to function as degassing holes. Due to the through holes 26X, 28X, 30X and 32X functioning as the degassing holes, voids can be suitably suppressed from occurring inside the wiring substrate 11. Incidentally, each of the degassing holes means a gas evacuating hole for evacuating gas occurring inside the wiring substrate during heating, to the outside in the manufacturing process of the wiring substrate.

(7) The shield pattern 26B adjacent to the wiring patterns 28A in the layering direction is formed to overlap the wiring patterns 28A in plan view. Thus, shield performance of the shield pattern 26B can be improved.

Change Examples of First Embodiment

Incidentally, the aforementioned first embodiment can be changed and carried out in the following manner. In the aforementioned first embodiment, the connecting sections 47 of the coupling portions 45 in the shield pattern 26B are formed to extend in the direction perpendicular to the extension direction (the direction consistent with the bending direction here) of the extending sections 46 and 48. In other words, the connecting sections 47 are formed to extend in the direction parallel with the extension direction of the support portions 44. However, the structure of each of the connecting sections 47 is not limited thereto.

Figure 12:
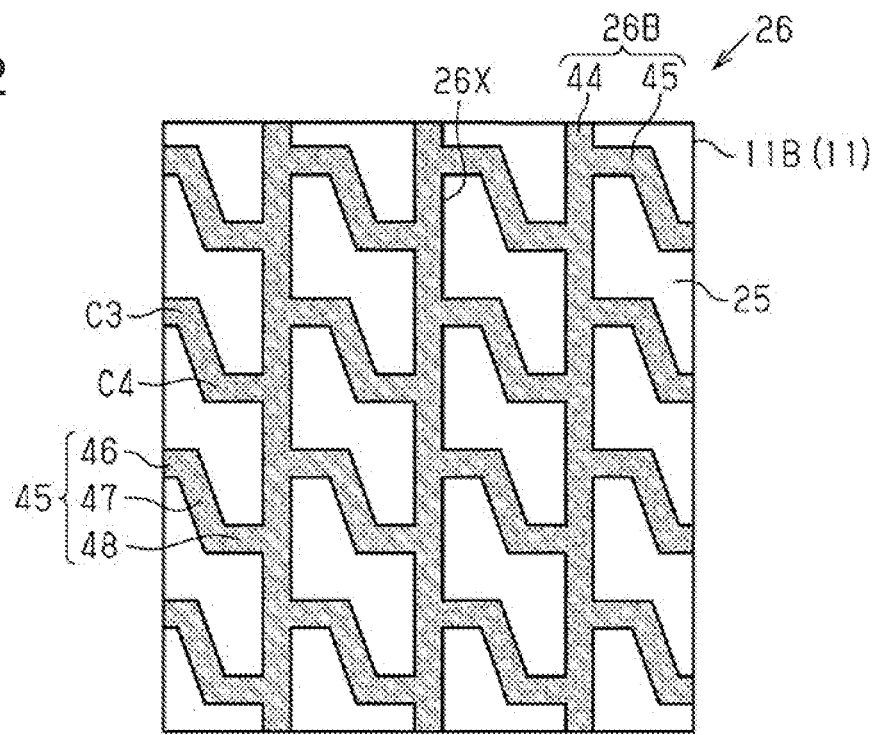
FIG. 12 is a schematic plan view showing a wiring substrate according to a change example.

For example, as shown in FIG. 12, the connecting sections 47 of the coupling portions 45 may be formed to extend in a direction intersecting the extension direction (the direction consistent with the bending direction here) of the extending sections 46 and 48. For example, the connecting sections 47 may be formed to be inclined to the extension direction of the support portions 44 in plan view. Incidentally, the other shield patterns 28B, 30B and 32B can be also changed in a similar manner or the same manner.

In addition, in the aforementioned first embodiment, the extending sections 46 and 48 of the coupling portions 45 in the shield pattern 26B are formed to extend along the bending direction. In other words, the extending sections 46 and 48 are formed to extend in the direction perpendicular to the extension direction of the support portions 44. However, the structures of the extending sections 46 and 48 are not limited thereto. For example, the extending sections 46 and 48 of the coupling portions 45 may be formed to extend in a direction intersecting the extension direction of the support portions 44. That is, the extending sections 46 and 48 may be formed to be inclined to the extension direction of the support portions 44 in plan view. Incidentally, the other shield patterns 28B, 30B and 32B can be also changed in a similar manner or the same manner.

Second Embodiment

A second embodiment will be described below in accordance with FIG. 13. A wiring substrate according to the embodiment is different from the wiring substrate according to the aforementioned first embodiment in structures of shield patterns provided in each non-mounting region. Different points of the second embodiment from the first embodiment will be mainly described below. Members identical to the previously mentioned members shown in FIGS. 1 to 12 will be referred to by the same signs correspondingly and respectively, and detailed description about elements of the respective members will be omitted.

Figure 13:
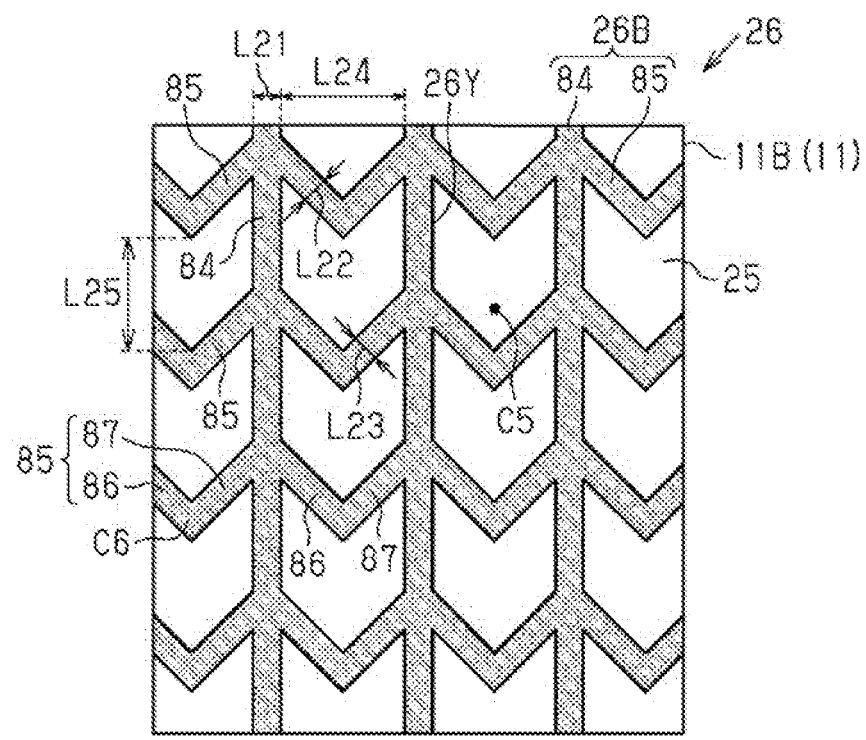
FIG. 13 is a schematic plan view showing a wiring substrate according to a change example.

As shown in FIG. 13, a plurality of through holes 26Y which penetrate a shield pattern 26B disposed in each non-mounting region 11B in its thickness direction are formed in the shield pattern 26B. The plurality of through holes 26Y are arranged at predetermined intervals. The plurality of through holes 26Y are, for example, provided at the predetermined intervals in a bending direction, and provided at the predetermined intervals in a short direction perpendicular to the bending direction in plan view.

Each of the through holes 26Y in the present example is formed into a V-shape having one bent portion C5 in plan view. The plurality of through holes 26Y are, for example, formed into the same planar shape and the same size as one another. The plurality of through holes 26Y are, for example, disposed to face in the same direction as one another. The shield pattern 26B is defined as an approximate grating pattern by the plurality of through holes 26Y.

The shield pattern 26B in the present example has a plurality of support portions 84 and a plurality of coupling portions 85. The support portions 84 each extending along the short direction intersecting the bending direction in plan view are formed in parallel with one another. Each of the coupling portions 85 is formed between adjacent ones of the support portions 84, and formed so as to connect the adjacent support portions 84 to each other.

Each of the support portions 84 is, for example, formed to extend in a linear shape with a predetermined width. The support portions 84 are, for example, provided at predetermined intervals in the bending direction. In the example shown in FIG. 13, three support portions 84 are provided, but the number of the support portions 84 is not limited particularly. However, two support portions 84 may be provided, or four or more support portions 84 may be provided.

A plurality of coupling portions 85 are, for example, provided at predetermined intervals in the short direction perpendicular to the bending direction between adjacent ones of the support portions 84. A plurality of coupling portions 85 are, for example, provided at predetermined intervals in the bending direction. In the present example, the plurality of coupling portions 85 provided side by side in the bending direction are provided side by side at the same positions in the short direction. The plurality of coupling portions 85 are, for example, formed into the same planar shape and the same size as one another. The plurality of coupling portions 85 are, for example, disposed to face in the same direction as one another.

Each of the coupling portions 85 in the present example is formed into a V-shape having one bent portion C6 in plan view. To give detailed description, the coupling portion 85 has an extending section 86 and an extending section 87. The extending section 86 extends along a direction (an example of a third direction) intersecting an extension direction of the support portion 84. The extending section 87 extends from an end of the extension section 86 and along a direction (an example of a fourth direction) intersecting both the extension direction of the support portion 84 and the extension direction of the extending section 86. The extending section 87 in the present example is formed to extend in the direction intersecting the extension direction of the support portion 84 and the direction perpendicular to the extension direction of the extending section 86. That is, in the coupling portion 85 in the present example, the extending portion 87 is formed to bend substantially at right angles to the extending section 86. Thus, the extension direction of the extending section 86 and the extension direction of the extending section 87 are not parallel with each other. In the coupling portion 85, the bent portion C6 is formed at a connecting part between the extending section 86 and the extending section 87. In the coupling portion 85, for example, the extending section 86 and the extending section 87 are provided at the same positions as each other in the short direction. The extending section 86 and the extending section 87 are, for example, formed into the same planar shape as each other, and formed into the same size as each other. An end of the extending section 86 is connected to one support portion 84 of adjacent support portions 84, and an end of the extending section 87 is connected to the other support portion 84 of the adjacent support portions 84. For example, the adjacent support portions 84, the extending section 86 and the extending section 87 are formed continuously and integrally with one another.

Thus, each of the coupling portions 85 formed between the adjacent support portions 84 in the shield pattern 26B is formed into the shape having the bent portion C6 in plan view. Thus, the coupling portion 85 can be made to have springiness. Accordingly, excellent bendability can be secured due to the springiness.

Here, a bending-direction length L21 of the support portion 84 (i.e. a width of the support portion 84) can be, for example, set in a range of about 25 to 100 µm. A width L22 of the extending section 86 can be, for example, set in a range of about 25 to 100 µm. A width L23 of the extending section 87 can be, for example, set in a range of about 25 to 100 µm. A spacing distance L24 between the adjacent support portions 84 in the bending direction can be, for example, set in a range of about 250 to 350 µm. A spacing distance L25 between adjacent coupling portions 85 in the short direction can be, for example, set in a range of about 350 to 450 µm. The aforementioned dimensions of the respective members are set suitably based on shield performance, a bending elastic modulus, etc. requested of the shield pattern 26B.

In the present embodiment, the width L21 of the support portion 84, the width L22 of the extending section 86, and the width L23 of the extending section 87 are set to be the same length as one another. In addition, in the present embodiment, the spacing distance L24 between the adjacent support portions 84 in the bending direction is set to be shorter than the spacing distance L25 between the adjacent coupling portions 85 in the short direction.

Incidentally, although not shown, through holes having the same planar shape as the through holes 26Y are formed at the same intervals as the through holes 26Y in the shield patterns 28B, 30B and 32B (see FIG. 2) belonging to the wiring layers 28, 30 and 32 respectively. For example, the through holes formed in the wiring layers 26, 28, 30 and 32 adjacent in a layering direction are formed to overlap one another in plan view.

According to the present embodiment which has been described above, effects similar to or the same as those according to the aforementioned first embodiment can be obtained.

Other Embodiments

The aforementioned embodiments can be changed and carried out in the following manner. Each of the aforementioned embodiments can be combined with any of the following change examples and carried out in a scope in which the both are not technically contradictory to each other. Incidentally, in the following description, change examples of the shield pattern 26B will be mainly described. However, the other shield patterns 28B, 30B and 32B can be also changed in a similar manner or the same manner.

In the aforementioned first embodiment, each of the support portions 44 of the shield pattern 26B is formed to extend along the direction perpendicular to the bending direction. However, the support portion 44 is not limited thereto.

Figure 14:
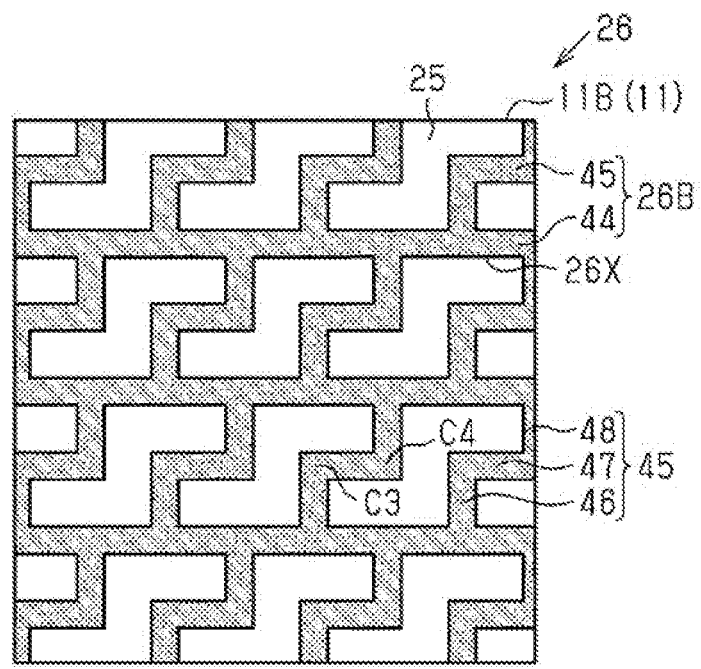
FIG. 14 is a schematic plan view showing a wiring substrate according to a change example.

For example, as shown in FIG. 14, each of support portions 44 may be formed to extend in the bending direction. In this case, each of coupling portions 45 is formed between ones of the support portions 44 adjacent to each other in the short direction perpendicular to the bending direction. Incidentally, a shield pattern 26B shown in FIG. 14 has a structure in which the shield pattern 26B shown in FIG. 3 is rotated rightward (clockwise) by 90° in plan view.

In the aforementioned second embodiment, each of the support portions 84 of the shield pattern 26B is formed to extend in the direction perpendicular to the bending direction. However, the support portion 84 is not limited thereto.

Figure 15:
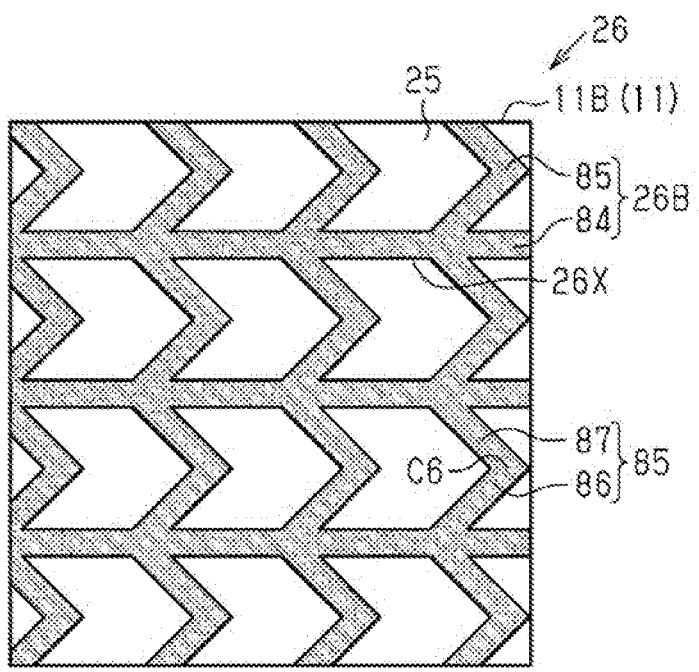
FIG. 15 is a schematic plan view showing a wiring substrate according to a change example.

For example, as shown in FIG. 15, each of support portions 84 may be formed to extend along the bending direction. In this case, each of coupling portions 85 is formed between ones of the support portions 84 adjacent to each other in the short direction perpendicular to the bending direction. Incidentally, a shield pattern 26B shown in FIG. 15 has a structure in which the shield pattern 26B shown in FIG. 13 is rotated leftward (counterclockwise) by 90° in plan view.

In the aforementioned first embodiment, the through holes 26X, 28X, 30X and 32X formed in the shield patterns 26B, 28B, 30B and 32B adjacent to one another in the layering direction are disposed to overlap one another in plan view. However, the disposition of the through holes 26X, 28X, 30X and 32X is not limited thereto.

Figure 16:
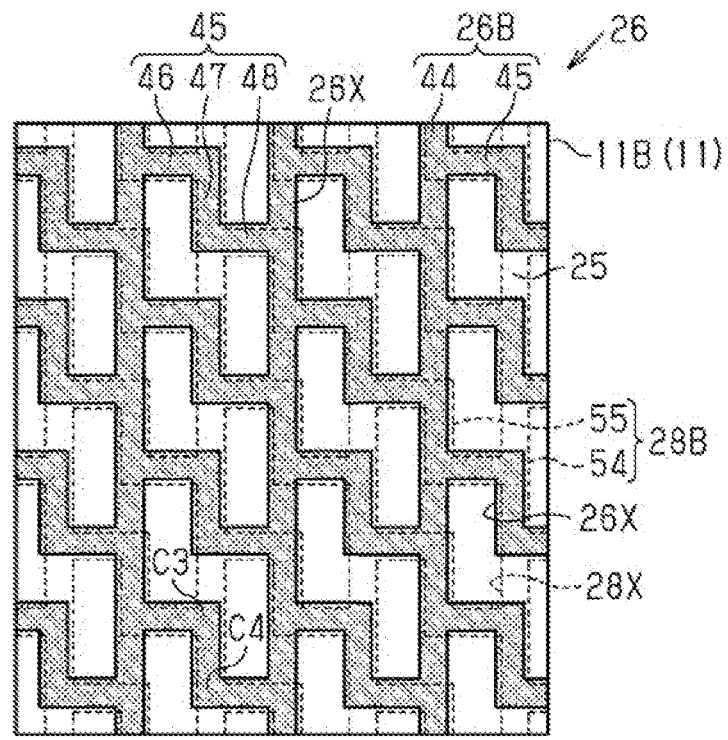
FIG. 16 is a schematic plan view showing a wiring substrate according to a change example.

For example, as shown in FIG. 16, through holes 26X and 28X adjacent to each other in the layering direction may be formed at positions shifted from each other in plan view. For example, the through holes 28X may be formed to be disposed zigzag with the through holes 26X respectively in plan view, and partially overlap the through holes 26X respectively in plan view. According to the configuration, shield patterns 26B and 28B defined by the through holes 26X and 28X are formed at positions shifted from each other in plan view. Therefore, while the through holes 26X and 28X are formed to improve bendability, a wide region can be covered with the shield patterns 26B and 28B. Thus, shield performance attained by the shield patterns 26B and 28B can be improved.

Incidentally, the shield patterns 26B and 28B in the aforementioned first embodiment have been described here. However, the shield patterns 26B and 28B according to the aforementioned second embodiment can be also changed in a similar manner or the same manner.

In the shield pattern 26B according to the aforementioned first embodiment, the plurality of coupling portions 45 provided to be arranged side by side along the bending direction are arranged side by side at the same positions in the short direction. However, the arrangement of the coupling portions 45 is not limited thereto.

Figure 17:
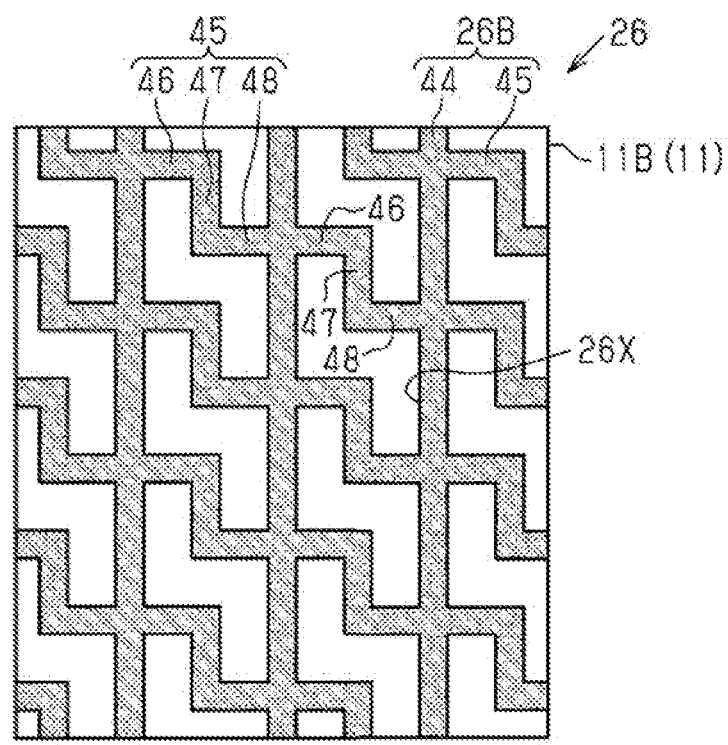
FIG. 17 is a schematic plan view showing a wiring substrate according to a change example.

For example, as shown in FIG. 17, a plurality of coupling portions 45 arranged side by side in the bending direction may be formed at positions shifted from one another in the short direction. For example, the coupling portions 45 adjacent to one another in the bending direction may be disposed zigzag. In the example shown in FIG. 17, an extending section 46 of each of the coupling portions 45 is disposed at the same position in the short direction as an extending section 48 of another coupling portion 45 which is adjacent to the aforementioned coupling portion 45 in the bending direction.

Incidentally, the shield pattern 26B according to the aforementioned first embodiment has been described here. However, the shield pattern 26B according to the aforementioned second embodiment can be also changed in a similar manner or the same manner. The structure of the coupling portion 45, 85 in each of the aforementioned embodiments is not limited particularly. That is, the planar shape of the coupling portion 45, 85 does not have to be limited particularly as long as the shape of the coupling portion 45, 85 is a shape having at least one bent portion. For example, the planar shape of the coupling portion 45, 85 may be changed to a shape having three or more bent portions. For example, the coupling portion 45, 85 may be formed into a U-shape or a W-shape in plan view.

In the aforementioned first embodiment, the width L1 of the support portion 44, the width L4 of the connecting section 47, the width L7 of the extending section 46, and the width L8 of the extending section 48 are set to be the same length as one another. However, the widths L1, L4, L7 and L8 may be set to be different lengths from one another. For example, the width L4 of the connecting section 47 may be set to be shorter than each of the width L1 of the support portion 44 and the widths L7 and L8 of the extending sections 46 and 48. In addition, the width L1 of the support portion 44 may be set to be longer than each of the width L4 of the connecting section 47 and the widths L7 and L8 of the extending sections 46 and 48.

In the aforementioned second embodiment, the width L21 of the support portion 84, the width L22 of the extending section 86 and the width L23 of the extending section 87 are set to be the same length as one another. However, the widths L21, L22 and L23 may be set to be different lengths from one another. For example, the width L21 of the support portion 84 may be set to be longer than each of the widths L22 and L23 of the extending sections 86 and 87.

In the aforementioned first embodiment, the shield patterns 26B, 28B, 30B and 32B disposed in the non-mounting region 11B are formed into substantially the same planar shape as one another. The shapes of the shield patterns 26B, 28B, 30B and 32B do not have to be limited thereto. For example, the shield patterns 26B, 28B, 30B and 32B disposed in the non-mounting region 11B may be formed into different planar shapes from one another. For example, in the shield patterns 26B, 28B, 30B and 32B, the coupling portions 45, 55, 65 may be formed into different planar shapes from one another.

In addition, in the aforementioned first embodiment, the through holes 26X, 28X, 30X and 32X having the bent portions are formed in all the shield patterns 26B, 28B, 30B and 32B disposed in the non-mounting region 11B. The structure of the non-mounting region 11B is not limited thereto. Shield patterns free from through holes having bent portions may be provided in the non-mounting region 11B. For example, through holes having bent portions may be formed in at least one shield pattern of the shield patterns 26B, 28B, 30B and 32B disposed in the non-mounting region 11B.

Figure 18:
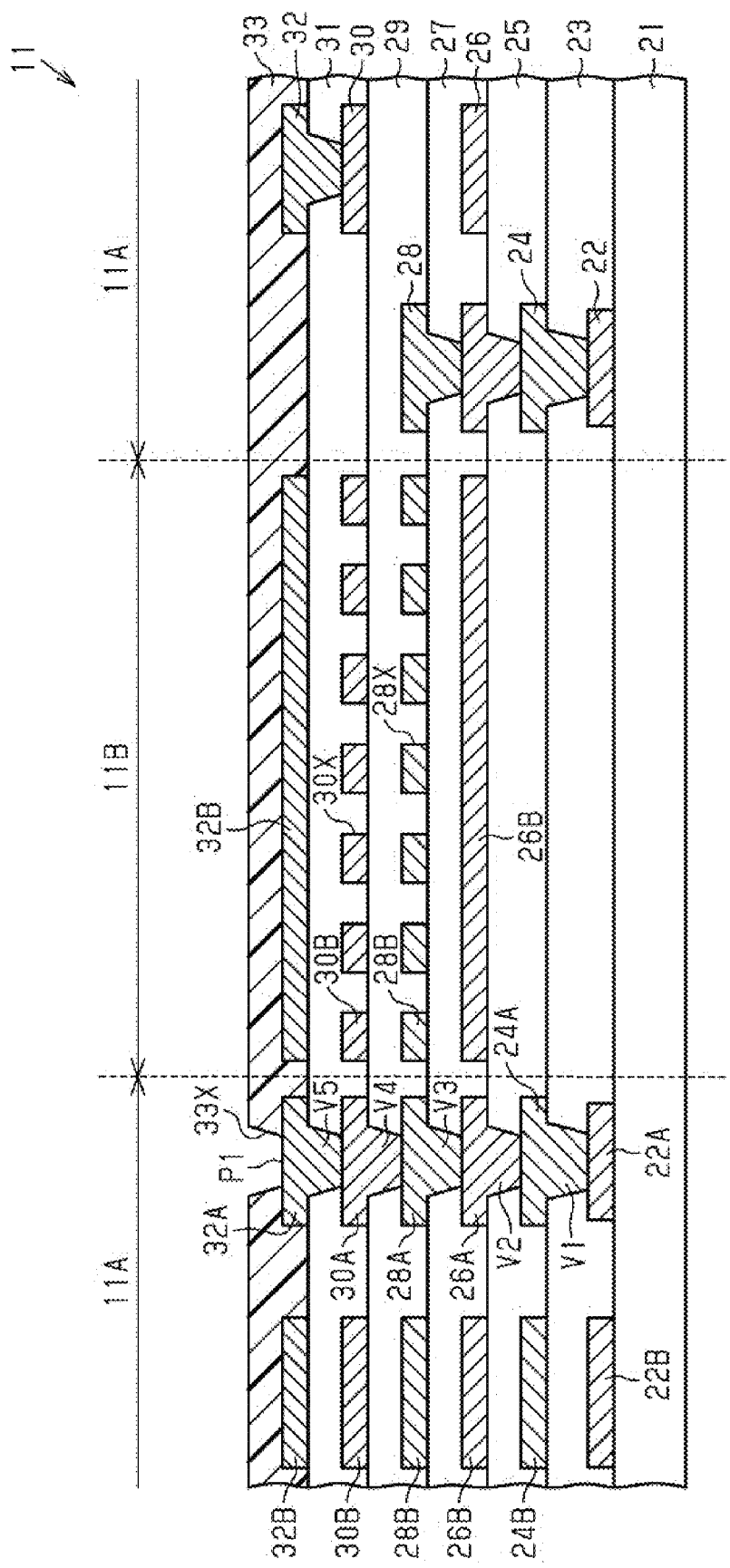
FIG. 18 is a schematic plan view showing a wiring substrate according to a change example and
FIG. 19 is a graph showing simulation results.

For example, in a wiring substrate 11 shown in FIG. 18, through holes having bent portions are not formed in shield patterns 26B and 32B disposed in each non-mounting region 11B. The shield patterns 26B and 32B are formed solidly respectively on upper faces of insulating layers 25 and 31 in the non-mounting region 11B. The shield pattern 26B is, for example, formed to cover substantially the whole upper face of the insulating layer 25 in the non-mounting region 11B. The shield pattern 32B is, for example, formed to cover substantially the whole upper face of the insulating layer 31 in the non-mounting region 11B. Thus, the shield patterns 26B and 32B positioned as outermost layers of the shield patterns 26B, 28B, 30B and 32B disposed in the non-mounting region 11B are solidly formed in the wiring substrate 11 shown in FIG. 18.

Incidentally, although the wiring substrate 11 according to the aforementioned first embodiment has been described here, the wiring substrate 11 according to the aforementioned second embodiment can be also changed in a similar manner or the same manner. The number of the wiring layers in each of the mounting region 11A and the non-mounting region 11B in each of the aforementioned embodiments is not limited particularly. For example, the number of the wiring layers in the non-mounting region 11B may be the same as the number of the wiring layers in the mounting region 11A.

According to the configuration made in each of the aforementioned embodiments, the whole lower face of the wiring layer 22 which is the lowermost layer is covered with the insulating layer 21. However, the configuration may be made to partially expose the lower face of the wiring layer 22 from the insulating layer 21. In each of the aforementioned embodiments, the wiring substrate 11 is embodied as a coreless substrate. However, the wiring substrate 11 is not limited thereto. For example, the wiring substrate 11 may be embodied as a wiring substrate having a core substrate.

(Simulation of Bending Elastic Modulus)

Simulation was performed about bending elastic moduli of wiring substrates each having a similar layer structure to or the same layer structure as the wiring substrate 11, i.e. the wiring substrates each having six wiring layers in each mounting region 11A and four wiring layers in each non-mounting region 11B. The simulation was performed on ½ object models by use of an analysis tool (specifically, Ansys Workbench v18).

(Simulation Conditions)

First, model structures of Examples 1 to 4 and a model structure of Comparative Example 1 will be described. Each of the model structures of Examples 1 to 4 and Comparative Example 1 has a similar layer structure to or the same layer structure as the wiring substrate 11 having the structure shown in FIG. 2. Structures of shield patterns 26B, 28B, 30B and 32B disposed in the non-mounting region 11B are different among Example 1, Example 2, Example 3, Example 4, and Comparative Example 1. Incidentally, in each of the model structures of the examples, the shield patterns 26B, 28B, 30B and 32B are formed into the same structures as one another, so that the shield patterns 26B, 28B, 30B and 32B are formed to entirely overlap one another in plan view. Therefore, in the following description, only the structure of the shield pattern 26B in each of the examples will be described.

The shield pattern 26B in Example 1 has a similar structure to or the same structure as the structure shown in FIG. 3, and has a structure in which a plurality of through holes 26X each having a crank shape in plan view are formed. That is, the shield pattern 26B in Example 1 has support portions 44 and coupling portions 45. The support portions 44 extend along a direction perpendicular to a bending direction. Each of the coupling portions 45 is formed between adjacent ones of the support portions 44 and formed into the crank shape having two bent portions C3 and C4. A width L1 of each of the support portions 44, a width L4 of each of connecting sections 47, a width L7 of each of extending sections 46, and a width L8 of each of extending sections 48 are set at 50 μm. A spacing distance L2 between adjacent ones of the support portions 44 in a bending direction is set at 350 μm, a spacing distance L10 between adjacent ones of the extending sections 46 in a short direction is set at 300 μm. A bending-direction length L3 of each of the extending sections 46 is set at 125 μm, a bending-direction length L5 of each of the extending sections 48 is set at 125 μm, and a spacing distance L9 between adjacent ones of the coupling portions 45 in the short direction is set at 125 μm.

The shield pattern 26B in Example 2 has a similar structure to or the same structure as the structure shown in FIG. 14, and has a structure in which a plurality of through holes 26X each having a crank shape in plan view are formed. That is, the shield pattern 26B in Example 2 has support portions 44 and coupling portions 45. The support portions 44 extend along a bending direction. Each of the coupling portions 45 is formed between adjacent ones of the support portions 44, and formed into the crank shape having two bent portions C3 and C4. Dimensions of respective members are the same as those in Example 1.

The shield pattern 26B in Example 3 has a similar structure to or the same structure as the structure shown in FIG. 13, and has a structure in which a plurality of through holes 26Y each having a V-shape in plan view are formed. That is, the shield pattern 26B in Example 3 has support portions 84 and coupling portions 85. The support portions 84 extend along a direction perpendicular to a bending direction. Each of the coupling portions 85 is formed between adjacent ones of the support portions 84, and formed into the V-shape having one bent portion C6. A width L21 of each of the support portions 84, a width L22 of each of extending sections 86, and a width L23 of each of extending sections 87 are set at 50 μm. A spacing distance L24 between adjacent ones of the support portions 84 is set at 300 μm, and a spacing distance L25 between adjacent ones of the coupling portions 85 in the short direction is set at 400 μm.

The shield pattern 26B in Example 4 has a similar structure to or the same structure as the structure shown in FIG. 15, and has a structure in which through holes 26Y each having a V-shape in plan view are formed. That is, the shield pattern 26B in Example 4 has support portions 84 and coupling portions 85. Each of the support portions 84 extends along a bending direction. Each of the coupling portions 85 is formed between adjacent ones of the support portions 84, and formed into the V-shape having one bent portion C6. Dimensions of respective members are the same as those in Example 3.

The dimensions of the shield patterns 26B in the aforementioned Examples 1 to 4 are set so that remaining copper rates are substantially the same as one another. The shield pattern 26B in Comparative Example 1 has only a solid pattern where no through hole is formed.

Simulation was performed about the bending elastic moduli in the non-mounting regions 11B in the aforementioned Examples 1 to 4 and the aforementioned Comparative Example 1. Consequently, results in FIG. 19 were obtained.

(Simulation Results)

Figure 19:
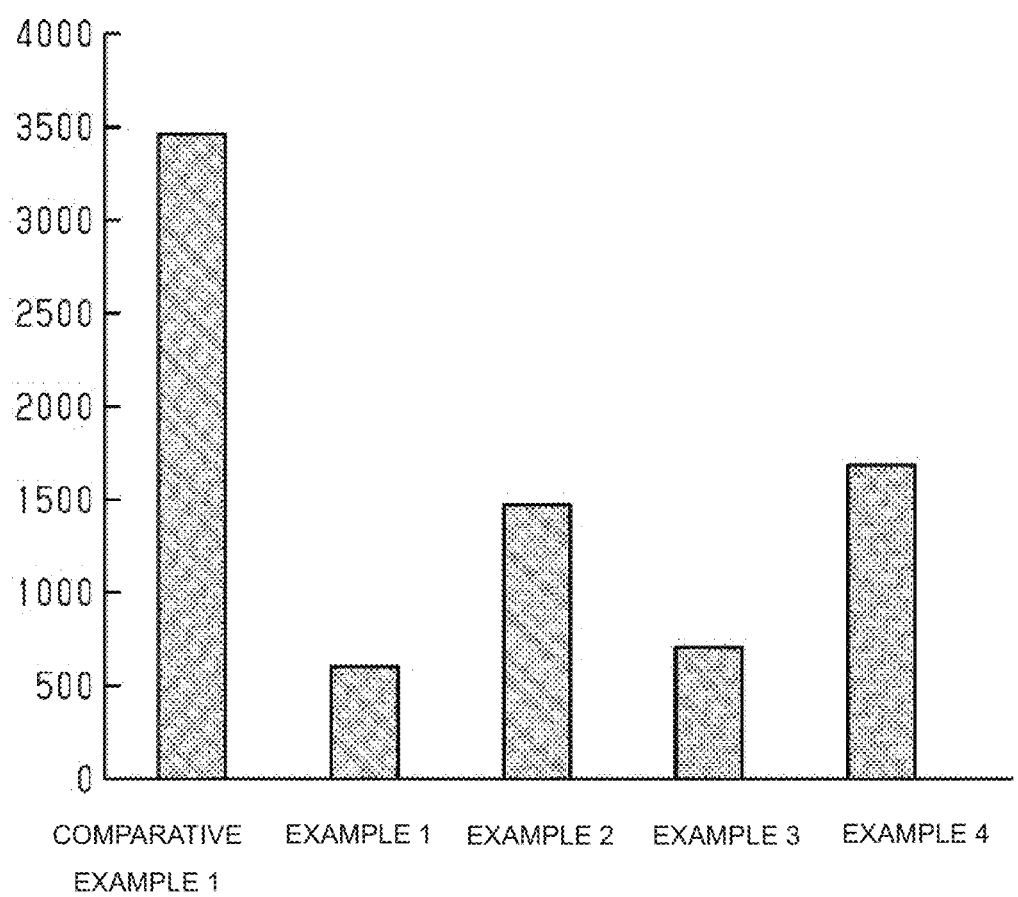

As shown in FIG. 19, it was confirmed that the bending elastic modulus of the non-mounting region 11B in the case where the crank-shaped through holes 26X were formed in Example 1 or 2 or the case where the V-shaped through holes 26Y were formed in Example 3 or 4 could be reduced in comparison with that in the case where no through hole was formed in Comparative Example 1. Specifically, the bending elastic modulus of the non-mounting region 11B in each of Examples 1 to 4 where the through holes 26X or 26Y having the bent portions were formed was reduced by 50% or more in comparison with that in Comparative Example 1 where no through hole was formed.

In addition, it was confirmed that when the support portions 44 were extended along the direction perpendicular to the bending direction as in Example 1, the bending elastic modulus of the non-mounting region 11B could be further reduced by about 60% in comparison with that in the case (Example 2) where the support portions 44 were extended along the bending direction. In a similar manner or the same manner, it was confirmed that when the support portions 84 were extended along the direction perpendicular to the bending direction as in Example 3, the bending elastic modulus of the non-mounting region 11B could be further reduced by about 60% in comparison with that in the case (Example 4) where the support portions 84 were extended along the bending direction.

Further, it was confirmed that the degree of reduction in the bending elastic modulus of the non-mounting region 11B was larger in the case where the through holes 26X each having the crank shape in plan view were formed as in Example 1 than in the case where the through holes 26Y each having the V-shape in plan view were formed as in Example 3. Specifically, the bending elastic modulus of the non-mounting region 11B in Example 1 was further reduced by about 15% in comparison with that in Example 3.

From the above description, it can be seen that the bending elastic modulus of the non-mounting region 11B can be reduced when the through holes having the bent portions are formed in each of the shield patterns disposed in the non-mounting region 11B. Particularly, it can be seen that the bending elastic modulus of the non-mounting region 11B can be reduced effectively when the support portions 44, 84 having a higher rigidity structure than the coupling portions 45, 85 are extended along the direction perpendicular to the bending direction.

Although preferred embodiments etc. have been described above in detail, the present disclosure is not limited to the aforementioned embodiments etc. but various modifications and substitutions can be added to the aforementioned embodiments etc. without departing from the scope stated in CLAIMS.

What is claimed is:

1. A flexible wiring substrate comprising:
   a plurality of wiring layers; and
   a plurality of insulating layers,
   wherein the wiring substrate comprises:
   a mounting region on which an electronic component is to be mounted; and
   a non-mounting region on which no electronic component is to be mounted and which is configured to be bent along a longitudinal direction of the wiring substrate,
   at least one of the wiring layers comprises a shield pattern,
   the shield pattern disposed in the non-mounting region is defined by a plurality of through holes arranged at predetermined intervals; and
   each of the through holes has a bent portion bent in plan view.

2. The flexible wiring substrate according to claim 1, wherein:
   the shield pattern disposed in the non-mounting region comprises:
   a plurality of support portions which extend along a second direction and which are arranged in parallel with one another; and
   a coupling portion which is formed between adjacent ones of the support portions so as to connect the adjacent support portions,
   the coupling portion has at least one bent portion bent in plan view.

3. The flexible wiring substrate according to claim 2, wherein the second direction is a direction perpendicular to the first direction.

4. The flexible wiring substrate according to claim 2, wherein the second direction is a direction parallel with the first direction.

5. The flexible wiring substrate according to claim 2, wherein
   the coupling portion comprises:
   a first extending section which is connected to one of the adjacent support portions and which extends in a direction perpendicular to the second direction;
   a second extending section which is connected to the other of the adjacent support portions and which extends in the direction perpendicular to the second direction; and
   a connecting section which extends in the second direction and which has one end connected to the first extending section and the other end connected to the second extending section.

6. The flexible wiring substrate according to claim 2, wherein
   the coupling portion comprises:
   a third extending section which is connected to one of the adjacent support portions and which extends in a third direction intersecting the second direction; and
   a fourth extending section which has one end connected to the other of the adjacent support portions, and the other end connected to the third extending section, and which extends in a fourth direction intersecting the third direction and the second direction.

7. The flexible wiring substrate according to claim 1, wherein
   of the plurality of wiring layers, another wiring layer adjacent to the at least one wiring layer in a thickness direction of the wiring substrate has a second shield pattern,
   the second shield pattern disposed in the non-mounting region is defined by a plurality of through holes arranged at predetermined intervals,
   each of the second through holes has a planar shape substantially identical to a corresponding one of the through holes, and
   each of the second through holes overlaps the corresponding one of the through holes in plan view.

8. The flexible wiring substrate according to claim 1, wherein
   of the plurality of wiring layers, another wiring layer adjacent to the at least one wiring layer in a thickness direction of the wiring substrate has a wiring pattern, and
   the wiring pattern disposed in the non-mounting region overlaps the shield pattern in plan view.

9. The flexible wiring substrate according to claim 1, further comprising:

a via wiring electrically connecting adjacent wiring layers of the plurality of wiring layers in a thickness direction of the wiring substrate, wherein the via wiring is disposed in only the mounting region.

10. A semiconductor device comprising:
a flexible wiring substrate according to claim 1; and
an electronic component which is mounted on the wiring substrate.

11. A flexible wiring substrate comprising:
a plurality of wiring layers; and
a plurality of insulating layers,
wherein the wiring substrate comprises:
a plurality of mounting regions on each of which an electronic component is to be mounted, wherein the plurality of mounting regions are arranged in a first direction; and
a non-mounting region on which no electronic component is to be mounted and which is configured to be bent in the first direction, wherein the non-mounting region is located between adjacent mounting regions of the plurality of mounting regions in the first direction,
at least one of the wiring layers comprises a shield pattern,
the shield pattern disposed in the non-mounting region is defined by a plurality of through holes arranged at predetermined intervals; and
each of the through holes has a bent portion bent in plan view.

12. The flexible wiring substrate according to claim 11, wherein:
the shield pattern disposed in the non-mounting region comprises:
a plurality of support portions which extend along a second direction and which are arranged in parallel with one another; and
a coupling portion which is formed between adjacent ones of the support portions so as to connect the adjacent support portions,
the coupling portion has at least one bent portion bent in plan view.

13. The flexible wiring substrate according to claim 11, wherein
of the plurality of wiring layers, another wiring layer adjacent to the at least one wiring layer in a thickness direction of the wiring substrate has a second shield pattern,
the second shield pattern disposed in the non-mounting region is defined by a plurality of through holes arranged at predetermined intervals,
each of the second through holes has a planar shape substantially identical to a corresponding one of the through holes, and
each of the second through holes overlaps the corresponding one of the through holes in plan view.

14. The flexible wiring substrate according to claim 11, wherein
of the plurality of wiring layers, another wiring layer adjacent to the at least one wiring layer in a thickness direction of the wiring substrate has a wiring pattern, and
the wiring pattern disposed in the non-mounting region overlaps the shield pattern in plan view.

15. The flexible wiring substrate according to claim 11, further comprising:
a via wiring electrically connecting adjacent wiring layers of the plurality of wiring layers in a thickness direction of the wiring substrate, wherein the via wiring is disposed in only the mounting region.

16. A semiconductor device comprising:
a flexible wiring substrate according to claim 11; and
an electronic component which is mounted on the wiring substrate.

* * * * *